(12) United States Patent
Sakano et al.

(10) Patent No.: US 6,475,823 B1
(45) Date of Patent: Nov. 5, 2002

(54) PIEZOELECTRIC DEVICE WITH SEALED VIBRATION SPACE AND MANUFACTURING METHOD THEREOF

(75) Inventors: Shigeru Sakano; Akira Suzuki; Takahito Kiriyama; Seiichi Tajima; Ikuo Katoh, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/585,354

(22) Filed: Jun. 2, 2000

(30) Foreign Application Priority Data

Jun. 3, 1999 (JP) .......................................... 11-157077

(51) Int. Cl.$^7$ ............................................. H01L 21/00
(52) U.S. Cl. ........................ 438/53; 257/419; 29/25.35; 310/366
(58) Field of Search ........................... 438/53; 257/419; 333/191, 186; 29/25.35; 435/53; 310/366, 312, 348, 320

(56) References Cited

U.S. PATENT DOCUMENTS

| | | | | |
|---|---|---|---|---|
| 4,571,794 A | * | 2/1986 | Nakamura | 29/25.35 |
| 4,920,641 A | * | 5/1990 | Nakamura | 29/856 |
| 4,996,627 A | * | 2/1991 | Zias et al. | 361/283 |
| 5,302,880 A | * | 4/1994 | Kaida | 310/370 |
| 5,341,550 A | * | 8/1994 | Kaida | 29/25.35 |
| 5,889,351 A | * | 3/1999 | Okumura et al. | 310/321 |
| 6,002,308 A | * | 12/1999 | Gamo | 333/187 |
| 6,046,529 A | * | 4/2000 | Yoshida et al. | 310/348 |
| 6,078,229 A | * | 6/2000 | Funada et al. | 333/193 |
| 6,163,101 A | * | 12/2000 | Yoshida et al. | 310/348 |
| 6,215,229 B1 | * | 4/2001 | Kuroda et al. | 310/366 |

FOREIGN PATENT DOCUMENTS

| | | | |
|---|---|---|---|
| JP | 1-041309 | | 2/1989 |
| JP | 5-167381 | * | 7/1993 |
| JP | 5-167386 | * | 7/1993 |
| JP | 06-6175 A | * | 1/1994 |
| JP | 11-312945 | * | 11/1999 |
| JP | 2000-349584 | * | 12/2000 |

OTHER PUBLICATIONS

Carpenter; United States Patent Application Publication US 2002/0008438 A1.*

* cited by examiner

*Primary Examiner*—Wael Fahmy
*Assistant Examiner*—Fernando Toledo
(74) *Attorney, Agent, or Firm*—Oblon, Spivak, McClelland, Maier & Neustadt, P.C.

(57) ABSTRACT

The invention is directed to piezoelectric device having a vibration space that achieves a high degree of airtightness which is not readily reduced, and a manufacturing method thereof. First and second hollow layers are formed at first and second surfaces of a piezoelectric substrate to form first and second cavities around first and second electrodes respectively. The first and second cavities each have a uniform width and extend between a first surface and an opposing second surface of the first and second hollow layers respectively, around vibration portions of the piezoelectric element. First and second sealing layers are each formed on the second surface of the first and second hollow layers to seal the first and second cavities.

12 Claims, 27 Drawing Sheets

PIEZOELECTRIC DEVICE WITH SEALED VIBRATION SPACE AND MANUFACTURING METHOD THEREOF

BACKGROUND OF THE INVENTION

1. Field of the Invention

The present invention relates to a piezoelectric device that may be utilized as, for instance, a filter, a resonator or a vibrator, and a method of manufacturing this piezoelectric device.

2. Discussion of the Background

A sealed vibration space must be formed around a first electrode and a second electrode in this type of piezoelectric device. The degree of airtightness in such a vibration space and its volumetric capacity directly affect the characteristics of the piezoelectric device. Thus, when forming a vibration space, it is crucial to ensure that the vibration space achieves a high degree of airtightness, that it is supported by a film structure that does not cause any reduction in the degree of airtightness and that it maintains a constant spatial volume. In addition, it is also essential to ensure that no residue from the manufacturing process remains, in order to prevent the occurrence of characteristics defects.

The publications in the known art disclosing technologies for vibration space formation include Japanese Unexamined Patent Publication No. 41309/1989 and Japanese Unexamined Patent Publication No. 167381/1993. Japanese Unexamined Patent Publication No. 41309/1989 discloses that after applying a resist resin to a vibration portion of a piezoelectric element, a cover resin (a hollow layer) is applied onto a surface of the piezoelectric element while securing an opening communicating with a portion of an end edge of the resist resin. Next, after the cover resin is dried, the resist resin is dissolved by using an organic solvent or the like and is further discharged to the outside through the opening in the cover resin. In addition, the cavity formed by removing the resist resin is washed by means such as ultrasonic cleaning. Then, the opening is sealed to form a sealed vibration space.

Japanese Unexamined Patent Publication No. 167381/1993 discloses that after applying a resist resin to a vibration portion of a piezoelectric element, a resin layer (hollow layer) having an opening ranging over an area smaller than the planar area of the resist resin layer is formed on the resist resin. Then, after the resin layer (hollow layer) is dried, the resist resin is dissolved and discharged to the outside through the opening in the cover resin. By sealing the opening with a sealing layer, a sealed vibration space is formed. The sealing layer includes a first sealing layer and a second sealing layer. The first sealing layer has an indented portion to enclose the cavity area and is pasted onto the hollow layer. The second sealing layer is pasted onto the first sealing layer to seal the indented portion of the first sealing layer and the opening continuous with the cavity.

However, the prior art technologies described above do not readily satisfy the requirement of the vibration space discussed earlier. For instance, in the invention disclosed in Japanese Unexamined Patent Publication 41309/1989, the opening provided to facilitate the removal of the resist resin and to wash out the resist resin is located at the end edge of the hollow layer and residue of the resist resin tends to remain inside the cavity. In addition, since the thickness of the hollow layer around the opening is extremely small, cracks and the like occurring in this area may reduce the degree of airtightness.

In the invention disclosed in Japanese Unexamined Patent Publication No. 16738 1/1993, the airtightness cannot be sustained if a misalignment which occurs between the opening continuous with the cavity and the indented portion of the first sealing layer or between the cavity and the indented portion at the first sealing layer.

SUMMARY OF THE INVENTION

It is an object of the present invention to provide a piezoelectric device having a vibration space that achieves a high degree of airtightness, and a manufacturing method thereof.

It is a further object of the present invention to provide a piezoelectric device having a vibration space of which the airtightness is not readily reduced, and a manufacturing method thereof.

It is a still further object of the present invention to provide a piezoelectric device having a vibration space that maintains a constant spatial volume, and a manufacturing method thereof.

It is a still further object of the present invention to provide a piezoelectric device achieving a structure that does not readily allow residue from the manufacturing process to remain in the vibration space, and a manufacturing method thereof.

In order to achieve the objects described above, the present invention discloses a piezoelectric device realized in two modes.

Piezoelectric Device in First Mode

The piezoelectric device in the first mode comprises a piezoelectric element, a first film structure and a second film structure. The piezoelectric element includes a piezoelectric substrate, at least one first electrode and at least one second electrode. The first electrode is provided at a first surface of the piezoelectric substrate, whereas the second electrode is provided at a second surface of the piezoelectric substrate which faces opposite the first electrode.

The first film structure includes a first hollow layer and a first sealing layer. The first hollow layer has a first surface, an opposing second surface and at least one first cavity. The first cavity has a uniform width and extends between the first and second surfaces of the first hollow layer around a vibration portion of the piezoelectric element where the first electrode is provided. The first surface of the first hollow layer is disposed on the first surface of the piezoelectric substrate, and the first sealing layer is disposed on the second surface of the first hollow layer to seal the first cavity.

The second film structure includes a second hollow layer and a second sealing layer. The second hollow layer has a first surface, an opposing second surface and at least one second cavity. The second cavity has a uniform width and extends between the first and second surfaces of the second hollow layer around a vibration portion of the piezoelectric element where the second electrode is provided. The first surface of the second hollow layer is disposed on the second surface of the piezoelectric substrate, and the second sealing layer is disposed on the second surface of the second hollow layer to seal the second cavity.

As described above, in the piezoelectric device according to the present invention, the first electrode is provided at the first surface of the piezoelectric substrate. The second electrode, located at the second surface of the piezoelectric substrate, faces opposite the first electrode. The first and second electrodes constitute a vibration portion. As a result, piezoelectric vibration characteristics determined by the first and second electrodes are achieved.

The first hollow layer forms the first cavity around the vibration portion where the first electrode is provided. The first sealing layer is disposed on the first hollow layer to seal the first cavity. The second hollow layer forms the second cavity around the vibration portion where the second electrode is provided. The second sealing layer is disposed on the second hollow layer to seal the second cavity. Consequently, piezoelectric vibration occurs in the first and second cavities sealed by the first and second film structures respectively.

Since the first cavity has a uniform width and extends between the first and second surfaces of the first hollow layer, the resist resin, which is utilized under normal circumstances to form the first cavity, can be completely removed. Thus, characteristics defects caused by the presence of residual resist resin can be prevented.

The first sealing layer is disposed on the second surface of the first hollow layer to seal the first cavity. Since such a first sealing layer only needs to be disposed on the plane of the first hollow layer, the alignment of the first sealing layer relative to the first hollow layer, which is essential in the prior art, does not need to be performed. Thus, there is no likelihood of an erroneous alignment, which would reduce the degree of airtightness.

In addition, since the first sealing layer only needs to be disposed on the plane of the first hollow layer, a vibration space achieving a high degree of airtightness is formed. Furthermore, since a sufficient overlapping area is assured by positioning the first sealing layer on the plane of the first hollow layer, a vibration space, the airtightness of which is less readily reduced, is achieved.

The volumetric capacity of the first cavity (vibration space) is set at a constant spatial volume determined by the planar area of the first cavity and the layer thickness of the first hollow layer. Thus, constant characteristics can be assured.

It is obvious that the advantages achieved in the first film structure described above are also realized in the second film structure.

The method of manufacturing the piezoelectric device in the first mode described above includes a process for forming the first film structure and a process for forming the second film structure.

The process for forming the first film structure includes a step in which a first resist resin is applied to a first surface of a piezoelectric substrate having numerous sets of electrodes each constituted of a first electrode and a second electrode facing opposite each other at the first and second surface, so as to individually cover the first electrodes, a step in which a first resin layer used for the formation of a first hollow layer is formed at the first surface of the piezoelectric substrate over the area around the first resist resin, a step in which the first resist resin is removed and a through hole is formed for each first electrode and a step in which a first sealing layer is formed over the first resin layer.

The process for forming the second film structure includes a step in which a second resist resin is applied to the second surface of the piezoelectric substrate so as to individually cover the second electrodes, a step in which a second resin layer used for the formation of a second hollow layer is formed at the second surface of the piezoelectric substrate over the area around the second resist resin, a step in which the second resist resin is removed and a through hole is formed for each second electrode and a step in which a second sealing layer is formed over the second resin layer.

When these processes are implemented, hardly any residue from the manufacturing process remains in the first and second cavities (vibration spaces). In addition, a piezoelectric device which has vibration spaces that achieve a high degree of airtightness which is not readily reduced, and which achieves a constant spatial volume, can be manufactured.

Piezoelectric Device in Second Mode

The piezoelectric device in the second mode comprises a piezoelectric element, a first film structure, a second film structure and a third film structure. The piezoelectric element includes a piezoelectric substrate, at least one first electrode and at least one second electrode.

The at least one first electrode is provided at a first surface of the piezoelectric substrate and the at least one second electrode is provided at an opposing second surface of the piezoelectric substrate so that the at least one first electrode and the at least one second electrode are opposite each other. The at least one first electrode and the at least one second electrode constitute a vibration portion at the piezoelectric element.

The first film structure includes a plurality of first split layers and a first sealing layer. The plurality of first split layers each have a first surface and an opposing second surface and are positioned over at least one gap. At least one first cavity is formed by the at least one gap at the vibration portion of the piezoelectric element which includes the first electrode. The first surface of the plurality of first split layers is disposed on the first surface of the piezoelectric substrate, and the first sealing layer is disposed on the second surface of the plurality of first split layers to seal the at least one first cavity.

The second film structure includes a plurality of second split layers and a second sealing layer. The plurality of second split layers each have a first surface and an opposing second surface and are positioned over at least one gap. At least one second cavity is formed by the at least one gap at the vibration portion of the piezoelectric element which includes the second electrode. The first surface of the plurality of second split layers is disposed on the second surface of the piezoelectric substrate, and the second sealing layer is disposed on the second surface of the plurality of second split layers to seal the at least one second cavity.

The third film structure includes a third sealing layer and a fourth sealing layer which are each disposed on one of two opposing side surfaces of an assembly that includes the piezoelectric element, the first film structure and the second film structure to seal the at least one first cavity and the at least one second cavity at the two side surfaces.

In the piezoelectric device in the second mode, the first electrode is provided at the first surface of the piezoelectric substrate. The second electrode, located at the second surface of the piezoelectric substrate, faces opposite the first electrode. As a result, piezoelectric vibration characteristics determined by the first and second electrodes are achieved.

The first hollow layer forms the first cavity around the vibration portion where the first electrode is provided. The first sealing layer is formed over the first hollow layer. The second hollow layer forms the second cavity around the vibration portion where the second electrode is provided. The second sealing layer is formed over the second hollow layer. The third and fourth sealing layers of the third film structure are each formed at one of the two side surfaces of the assembly which includes the piezoelectric element, the first film structure and the second film structure to seal the first and second cavities at the two side surfaces. Thus, the piezoelectric element engages in piezoelectric vibration inside the first and second cavities sealed by the first film structure, the second film structure and the third film structure.

Since the two first split layers constituting the first film structure are provided over a distance from each other at the first surface of the piezoelectric substrate creating the first cavity corresponding to the distance between them at the first electrode, it is not necessary to use a resist resin, which is normally required to form the first cavity. Thus, characteristics defects caused by residual resist resin can be prevented.

The first sealing layer is disposed on the second surface of the first split layers to seal the first cavity created by the gap formed between the first split layers. Since the first sealing layer only needs to be disposed on the plane of the first split layers, alignment of the first sealing layer relative to the first split layers is not necessary, which is essential in the prior art. Thus, there is no risk of the airtightness becoming reduced as a result of an erroneous alignment.

In addition, since the first sealing layer only needs to be disposed on the plane of the first split layers, a vibration space achieving a high degree of airtightness is formed. Furthermore, since a sufficient overlapping area is assured by positioning the first sealing layer on the plane of the first split layers, a vibration space, the airtightness of which is less readily reduced, is achieved.

The volumetric capacity of the first cavity (vibration space) is set at a constant spatial volume determined by the planar area of the gap ranging over the distance between the first split layers and the layer thickness of the first split layers. Thus, constant characteristics can be assured.

Since the second split layers are provided over a distance from each other at the second surface of the piezoelectric substrate creating the second cavity corresponding to the distance between them at the second electrode, it is not necessary to use a resist resin, which is normally required to form the second cavity. Thus, characteristics defects caused by residual resist resin can be prevented.

The second sealing layer is disposed on the second surface of the second split layers to seal the second cavity created by the gap formed between the second split layers. Since the second sealing layer only needs to be disposed on the plane of the second split layers, alignment of the second sealing layer relative to the second split layers in not necessary, which is essential in the prior art. Thus, there is no risk of the airtightness becoming reduced as a result of an erroneous alignment.

In addition, since the second sealing layer only needs to be disposed on the plane of the second split layers, a vibration space achieving a high degree of airtightness is formed. Furthermore, since a sufficient overlapping area is assured by positioning the second sealing layer on the plane of the second split layers, a vibration space, the airtightness of which is less readily reduced, is achieved.

The volumetric capacity of the second cavity (vibration space) is set at a constant spatial volume determined by the planar area of the gap ranging over the distance between the second split layers and the layer thickness of the second split layers. Thus, constant characteristics can be assured.

The first cavity formed by the first film structure and the second cavity formed by the second film structure are sealed by the third film structure. Since the third film structure is formed at the two side surfaces of the assembly which includes the piezoelectric element, the first film structure and the second film structure, a sufficient bonding area or a sufficient pasting area is assured for the third film structure to achieve vibration spaces, the airtightness of which is less likely to become reduced.

In addition, since the third film structure is formed at the two side surfaces, the volumetric capacities of the first and second cavities do not fluctuate. The volumetric capacities of the first and second cavities are each set at a constant spatial volume determined by the planar area of the gap corresponding to the distance between the second split layers and the layer thickness of the second split layers. Thus, constant characteristics can be assured.

The method of manufacturing the piezoelectric device in the second mode described above includes a process for forming the first film structure and a process for forming the second film structure.

The process for forming the first film structure includes a step in which a first resist resin is applied in strips at a first surface of a piezoelectric substrate having numerous sets of electrodes each constituted of a first electrode and a second electrode facing opposite each other at the first and second surface so as to commonly cover a plurality of first electrodes, a step in which a first resin layer used to form a first hollow layer is formed at the first surface of the piezoelectric substrate in the area around the first resist resin, a step in which the first resist resin is removed and a through hole that contains the plurality of first electrodes is formed and a step in which a first sealing layer is formed over the first resin layer.

The process for forming the second film structure includes a step in which a second resist resin is applied in strips to the second surface of the piezoelectric substrate so as to commonly cover a plurality of second electrodes, a step in which a second resin layer used for the formation of a second hollow layer is formed at the second surface of the piezoelectric substrate in the area around the second resist resin, a step in which the second resist resin is removed and a through hole that contains the plurality of second electrodes is formed and a step in which the second sealing layer is formed over the second resin layer.

When these processes are implemented, hardly any residue from the manufacturing process remains in the first and second cavities (vibration spaces). In addition, a piezoelectric device which has vibration spaces that achieve a high degree of airtightness which is not readily reduced, and which achieves a constant spatial volume, can be manufactured.

The present invention also discloses specific examples of application in a piezoelectric device that may be used as, for instance, a filter, a resonator, a vibrator or the like.

BRIEF DESCRIPTION OF THE DRAWINGS

Other objects, structural features and advantages of the present invention are explained in further detail by referring to the attached drawings which merely illustrate examples, in which.

DETAILED DESCRIPTION OF THE PREFERRED EMBODIMENTS

Figure 1:
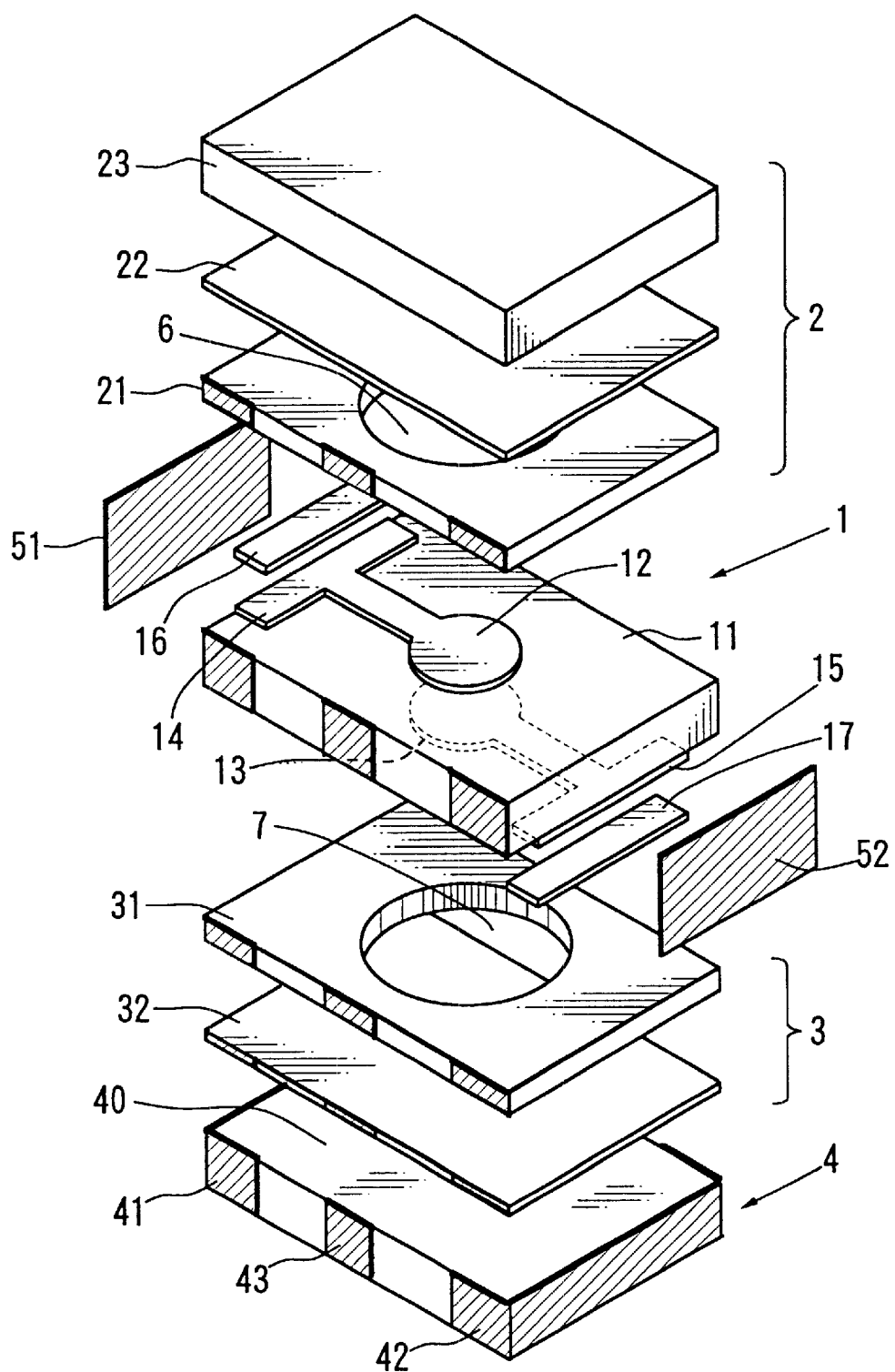
FIG. 1 is an exploded perspective of a piezoelectric device adopting the first mode of the present invention.
Figure 2:
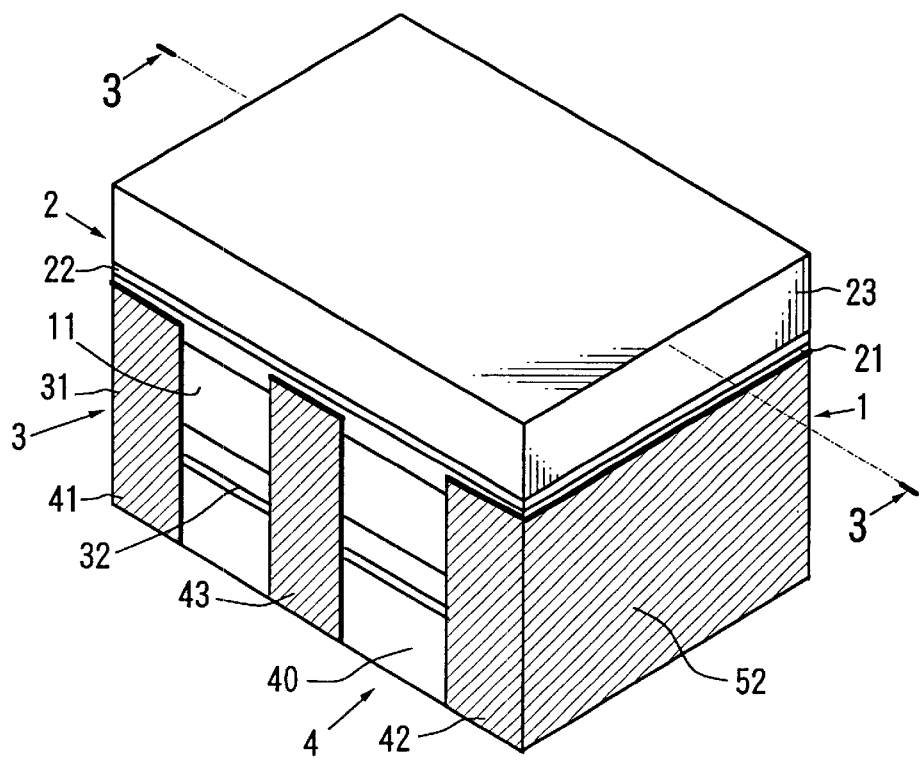
FIG. 2 is a perspective of the piezoelectric device according to the present invention.
Figure 3:
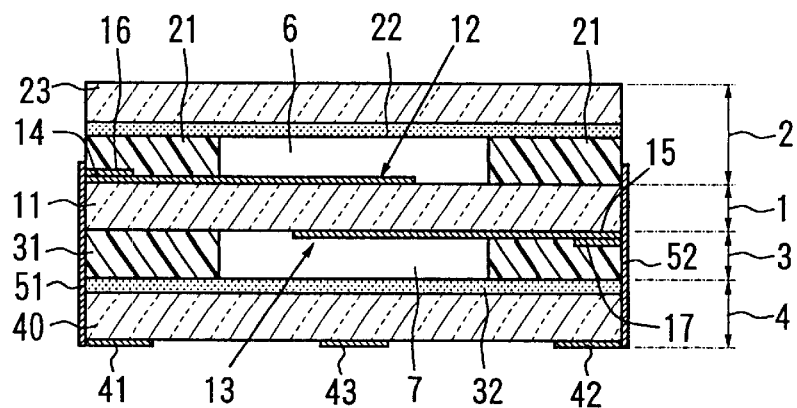
FIG. 3 is a sectional view taken along line 3—3 in FIG. 2.

The embodiment illustrated in FIGS. 1 to 3 represents an example of a piezoelectric device that is ideal in applications as a resonator, a vibrator and the like. The piezoelectric device in these figures comprises a piezoelectric element 1, a first film structure 2 and a second film structure 3.

The piezoelectric element 1 includes a piezoelectric substrate 11, a first electrode 12 and a second electrode 13. The first electrode 12, having a first lead electrode 14, is provided at a first surface of the piezoelectric substrate 11. An end of the first lead electrode 14, which is electrically continuous with the first electrode 12, is lead out to a side end edge of the piezoelectric substrate 11. The second electrode 13 is provided at an opposing second surface of the piezoelectric substrate 11 to face opposite the first electrode 12. The first electrode 12 and the second electrode 13 constitute a vibration portion.

An end of a second lead electrode 15 which is electrically continuous with the second electrode 13 is lead out to a side end edge of the piezoelectric substrate 11. The piezoelectric substrate 11 may be constituted of a material of the known art. The first electrode 12, the second electrode 13, the first lead electrode 14 and the second lead electrode 15 may be formed by adopting a thin film technology such as sputtering or a thick film technology.

In the embodiment, the first electrode 12 includes the first lead electrode 14, which is electrically continuous with the first electrode 12 and has an end thereof lead out to a side end edge of the piezoelectric substrate 11. The second electrode 13 includes the second lead electrode 15, which is electrically continuous with the second electrode 13 and has an end thereof lead out to a side end edge of the piezoelectric substrate 11.

The first film structure 2 is provided at the first surface of the piezoelectric substrate 11 to form a first cavity 6 achieving vibration around the first electrode 12, and to seal the first cavity 6. The first film structure 2 includes a first hollow layer 21 and a first sealing layer 22. The first hollow layer 21 has a first surface and an opposing second surface. The first surface of the first hollow layer 21 is disposed on the first surface of the piezoelectric substrate 11 and forms the first cavity 6 around the first electrode 12. The first hollow layer 21 is provided with a first through hole at its center, and the first through hole constitutes the first cavity 6. The first sealing layer 22, which is formed as a sheet, is disposed on the opposing second surface of the first hollow layer 21 to seal the first cavity 6.

The layer thickness of the first hollow layer 21 may be selected at a value within a range of, for instance 10 to 80 micrometer. In addition, the layer thickness of the first sealing layer 22 may be set within a range of, for instance, 3 to 50 micrometer.

The second film structure 3 is provided at the second surface of the piezoelectric substrate 11 to form a second cavity 7 to achieve vibration around the second electrode 13 and to seal the second cavity 7. The second film structure 3 includes a second hollow layer 31 and a second sealing layer 32. The second hollow layer 31 has a first surface and an opposing second surface. The first surface of the second hollow layer 31 is disposed on the second surface of the piezoelectric substrate 11 and forms the second cavity 7 around the second electrode 12. The second hollow layer 31 is provided with a second through hole at its center, and the second through hole constitutes the second cavity 7. The second sealing layer 32, which is provided over the second hollow layer 31, seals the second cavity 7.

The layer thickness of the second hollow layer 31 may be selected at a value within a range of, for instance 10 to 80 micrometer. In addition, the layer thickness of the second sealing layer 32 may be set within a range of, for instance, 3 to 50 micrometer.

The first hollow layer 21, the first sealing layer 22, the second hollow layer 31 and the second sealing layer 32 may be formed by, for instance, applying a synthetic resin through screen printing.

As described above, in the piezoelectric device in the first mode, the first electrode 12 is provided at the first surface of the piezoelectric substrate 11. The second electrode 13 is provided at the second surface of the piezoelectric substrate 11 and faces opposite the first electrode 12. The first electrode 12 and the second electrode 13 constitute the vibration portion. As a result, piezoelectric vibration characteristics determined by the first electrode 12 and the second electrode 13 are achieved.

The first hollow layer 21 constituting the first film structure 2 forms the first cavity 6 around the vibration portion that includes the first electrode 12. The first sealing layer 22 constituting the first film structure 2 is provided on the first hollow layer 21 to seal the first cavity 6. The second hollow layer 31 constituting the second film structure 3 forms the second cavity 7 around the vibration portion that includes the second electrode 13. The second sealing layer 32 constituting the second film structure 3 is provided on the second hollow layer 31 to seal the second cavity 7. Consequently, piezoelectric vibration occurs in the first cavity 6 and the second cavity 7 sealed by the first film structure 2 and the second film structure 3 respectively.

The first hollow layer 21 constituting the first film structure 2 is provided with the first through hole passing through the first hollow layer 21 over a uniform width along the direction of the layer thickness to form the first cavity 6 constituted of the first through hole around the first electrode 12. The first through hole constituting the first cavity 6 passes through the first hollow layer 21 over a uniform width along the direction of the layer thickness, and thus, the resist resin which is normally used to form the first cavity 6 can be completely removed. As a result, characteristics defects caused by residual resist resin can be prevented.

In the embodiment, the first sealing layer 22 formed as a sheet is deposited on the second surface of the first hollow layer 21 to seal the first cavity 6. Since such a first sealing layer 22 only needs to be pasted on the plane of the first hollow layer 21, the alignment of the first sealing layer 22 relative to the first hollow layer 21, which is essential in the prior art, is no longer necessary. Thus, no reduction in the degree of airtightness occurs as a result of an erroneous alignment.

Furthermore, since the first sealing layer 22 can be provided simply by pasting it on the plane of the first hollow layer 21, a vibration space achieving a high degree of airtightness can be formed. Also, by pasting the first sealing layer 22 on the plane of the first hollow layer 21, a sufficient pasting area is assured to achieve a vibration space, the airtightness of which is not readily reduced.

The first sealing layer 22 may be formed by means such as screen printing as well. In this case, too, the first sealing layer 22 only needs to be formed on the plane of the first hollow layer 21 and the alignment of the first sealing layer 22 relative to the first hollow layer 21, which is essential in the prior art, is no longer necessary. Thus, no reduction in the degree of airtightness occurs as a result of an erroneous alignment.

In particular, by selecting the layer thicknesses of the first and second hollow layers 21 and 31 at values within a range of 10 to 80 micrometer and setting the layer thicknesses of the first and second sealing layers 22 and 32 within the range of 3 to 50 micrometer, a high degree of airtightness can be sustained effectively.

In addition, the volumetric capacity of the first cavity 6 is set at a constant spatial volume determined by the planar area of the first through hole provided at the first hollow layer 21 and the layer thickness of the first hollow layer 21. As a result, constant characteristics are assured.

Although a detailed explanation is omitted, it is obvious that the advantages described above in reference to the first film structure 2 are also achieved in the second film structure 3.

The embodiment further includes a top plate 23, a base substrate 4 and two connection electrodes 51 and 52. The top plate 23 is bonded onto the first sealing layer 22 with an adhesive. The top plate 23 may be constituted of a ceramic sheet or an alamide sheet.

The base substrate 4 includes an insulating substrate 40, a first terminal electrode 41 and a second terminal electrode 42. The embodiment also includes a third terminal electrode 43 as illustrated in the figures. This base substrate 4 supports the assembly constituted of the piezoelectric element 1, the first film structure 2 and the second film structure 3 at one surface of the insulating substrate 40. By adopting this structure, the piezoelectric device reinforced by the base substrate 4 achieves a higher degree of mechanical strength.

The first terminal electrode 41 is formed at the side end surface of the assembly constituted of the base substrate 4, the second sealing layer 32, the second hollow layer 31, the piezoelectric element 1, the first hollow layer 21 and the first sealing layer 22 where the first lead electrode 14 is lead out, and also ranges over to a side end surface different from this side end surface.

The second terminal electrode 42 is formed at the side end surface of the assembly constituted of the base substrate 4, the second sealing layer 32, the second hollow layer 31, the piezoelectric element 1, the first hollow layer 21 and the first sealing layer 22 where the second lead electrode 15 is lead out, and also ranges over to a side end surface different from this side end surface. The insulating substrate 40 constituting the base substrate 4 may be constituted of ceramic.

The portions of the first terminal electrode 41 and the second terminal electrode 42 lead out to the side end surface different from the side end surfaces at which the first lead electrode 14 and the second lead electrode 15 are lead out, are used as solder joints for connection with the outside when mounting the piezoelectric device on a circuit board or the like. Thus, they should have a high degree of solderability. More specifically, a combined plated film structure achieved by constituting the lowermost layer, which is in contact with the insulating substrate 40, with a silver layer formed through printing, providing a nickel plated layer over the lowermost layer to prevent the silver layer from becoming corroded by the solder and providing a tin-plated layer or a solder-plated layer over the nickel layer to improve the solderability may be adopted.

The first terminal electrode 41, second terminal electrode 42 and the third terminal electrode 43 are formed in strips around the assembly over a distance from each other in the embodiment. The first terminal electrode 41 is set so that its end edge extends along a side end edge of the piezoelectric substrate 11, and the second terminal electrode 42 is set so that it side end edge extends along a side end edge of the piezoelectric substrate 11 on the opposite side from the first terminal electrode 41.

The first connection electrode 51 and the second connection electrode 52 are each formed at a side surface of the assembly to achieve electrical continuity for an end of the first terminal electrode 41 and an end of the first lead electrode 14 and to achieve electrical continuity for an end of the second terminal electrode 42 and an end of the second lead electrode 15. In the embodiment, the first connection electrode 51 and the second connection electrode 52 are formed at side surfaces facing opposite each other at the assembly and the base substrate 4. The first connection electrode 51 and the second connection electrode 52 may be formed as a thin film through a thin film formation process such as sputtering or vapor deposition, for instance. The first connection electrode 51 and the second connection electrode 52 may constitute part of the terminal electrodes 41 and 42 respectively, or they may be constituted as separate electrodes from the terminal electrodes 41 and 42.

It is obvious that by adopting the structure described above, it becomes unnecessary to provide a through conductor that passes through the piezoelectric substrate 11 along the direction extending from the front to the rear and a land (conductive pattern) for connecting the through conductor, and thus, a piezoelectric device suited for miniaturization is achieved.

Furthermore, by providing the first connection electrode 51 and the second connection electrode 52 at positions other than the external soldering areas of the first terminal electrode 41 and the second terminal electrode 42, the first connection electrode 51 and the second connection electrode 52 are allowed to remain unaffected by the solder applied to the terminal electrodes 41 and 42 for external connection to improve the reliability. In the embodiment illustrated in the figures, the first connection electrode 51 and the second connection electrode 52 are formed at side surfaces offset by approximately 90° from the side surfaces at which the surfaces of the first terminal electrode 41 and the second terminal electrode 42 emerge among the four side surfaces of the insulating substrate 40 and, as a result, no solder travels around to the first connection electrode 51 and the second connection electrode 52 when the first terminal electrode 41 and the second terminal electrode 42 are soldered on a circuit board.

In addition, since the first connection electrode 51 and the second connection electrode 52, which are allowed to remain unaffected by the solder applied to the terminal electrodes 41 and 42 for external connection, can be constituted of a conductive material that is different from the material constituting the first and second terminal electrodes 41 and 42, e.g. a thin film. The first and second terminal electrodes 41 and 42 may each adopt a plated film structure constituted of a plurality of layers achieved by taking into consideration adhesion to the base substrate 4 and the solderability characteristics and, as a result, a piezoelectric device achieving outstanding solderability is obtained.

Moreover, the first lead electrode 14 and the second lead electrode 15 are provided with end electrodes 16 and 17 respectively at the ends lead out to the side end edges of the piezoelectric substrate 11, and their film thicknesses over the areas where the end electrodes 16 and 17 are provided are larger than the thicknesses in other areas. In such a structure, the first lead electrode 14 and the second lead electrode 15 are allowed to come into contact with the first connection electrode 51 and the second connection electrode 52 over a larger contact area to improve the reliability of the electrical connection and the mechanical connection.

It is desirable to select the value of the thickness which includes the first lead electrode 14 and the end electrode 16 and the thickness which includes the second lead electrode 15 and the end electrode 17 emerging at the end surfaces exposed to the outside within a range of 0.5 to 20 micrometer. By assuring such thicknesses, disconnection failure resulting from thermal shock or the like can be reliably avoided.

The differences among the coefficients of thermal expansion of the piezoelectric substrate 11, the base substrate 4 and the top plate 23 are within a range of −5 ppm to +5 ppm.

More specifically, when the coefficient of thermal expansion of the piezoelectric substrate 11 is $\alpha 1$, the coefficient of thermal expansion of the base substrate 4 is $\alpha 2$ and the coefficient of thermal expansion of the top substrate 23 is $\alpha 3$, the conditions:

$-5 \text{ ppm} \leq \alpha 1 - \alpha 2 \leq +5 \text{ ppm}$, $-5 \text{ ppm} \leq \alpha 2 - \alpha 3 \leq +5 \text{ ppm}$ and $-5 \text{ ppm} \leq \alpha 1 - \alpha 3 \leq +5 \text{ ppm}$, are satisfied.

By ensuring that this requirement is met, deviation of the characteristics attributable to thermal stress can be minimized. This requirement may be satisfied through a combination of ceramic to constitute the base substrate 4, piezoelectric ceramic to constitute the piezoelectric substrate 11 and ceramic or alamide fiber to constitute the top plate 23. Alternatively, the base substrate 4 and the top plate 23 may be made of the same ceramic material which is used to form the piezoelectric substrate 11.

Figure 4:
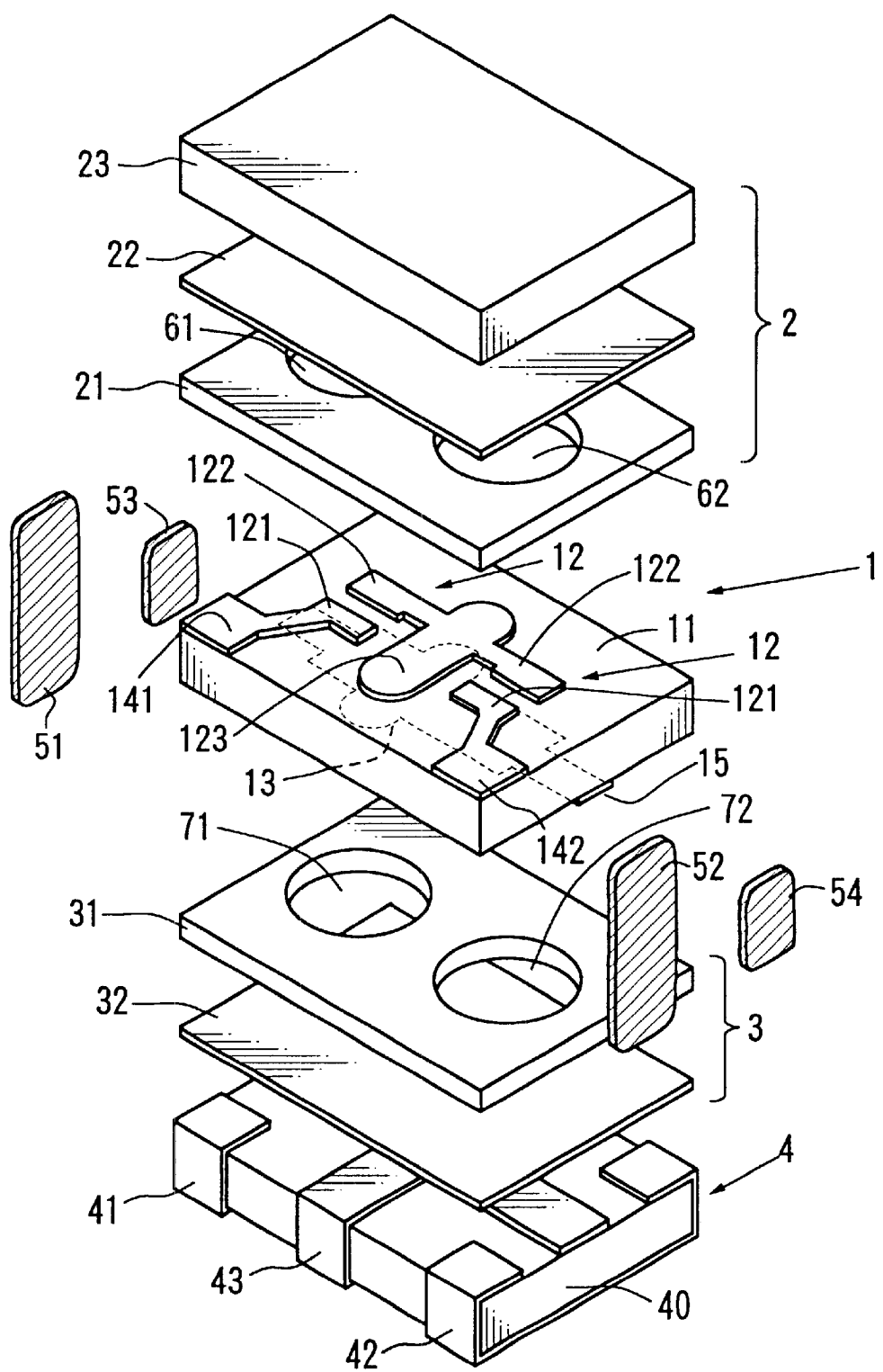
FIG. 4 is an exploded perspective illustrating another embodiment of the piezoelectric device according to the present invention.
Figure 5:
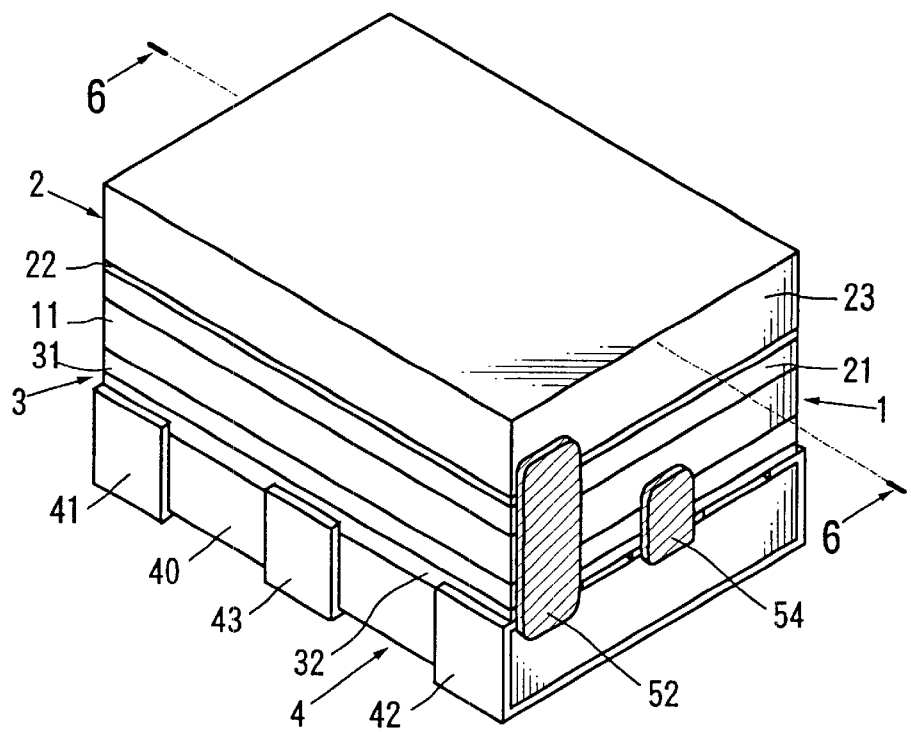
FIG. 5 is a perspective of the piezoelectric device shown in FIG. 4 in an assembled state.
Figure 6:
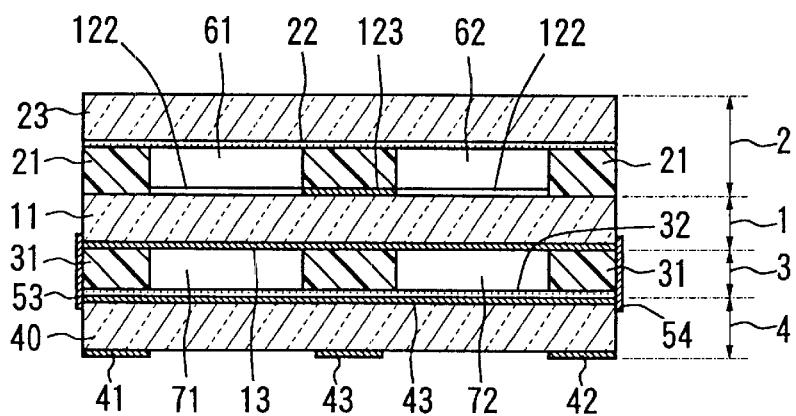
FIG. 6 is a sectional view taken along line 6—6 in FIG. 5.

Referring to FIGS. 4 to 6, another embodiment of the piezoelectric device according to the present invention is explained. In the figures, the same reference numbers are assigned to parts identical to those shown in FIGS. 1 to 3. The embodiment in these figures represents an example of a piezoelectric device ideal in application as a filter or the like.

The piezoelectric element 1 includes a piezoelectric substrate 11, first electrodes 12 and a second electrode 13. The first electrodes 12 and the second electrode 13 each adopt an electrode structure suited for application as a filter or the like. In the embodiment, two first electrodes 12 are provided.

Figure 7:
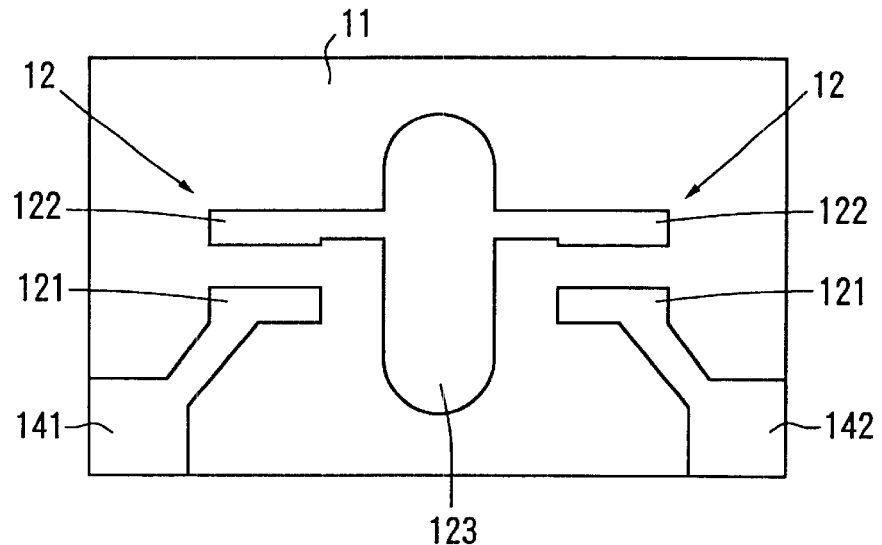
FIG. 7 is a plan view of the piezoelectric element included in the piezoelectric device shown in FIGS. 4 to 6.

Referring to FIG. 7, the two first electrodes 12 are provided at the first surface of the piezoelectric substrate 11 and each include a split electrode 121 and a split electrode 122. In this embodiment, the split electrodes 122 are connected with each other via a capacitor electrode 123 which is provided between them. One of the split electrodes 121 is provided with a first lead electrode 141, an end which is lead out to a side end edge of the piezoelectric substrate 11. Another of the split electrodes 121 is provided with another first lead electrode 142, an end of which is lead out to another side end edge of the piezoelectric substrate 11. In this embodiment, the first lead electrode 141 is lead out to the side end edge on the left of the piezoelectric substrate 11, and the first lead electrode 142 is lead out to the side end edge on the right of the piezoelectric substrate 11.

Figure 8:
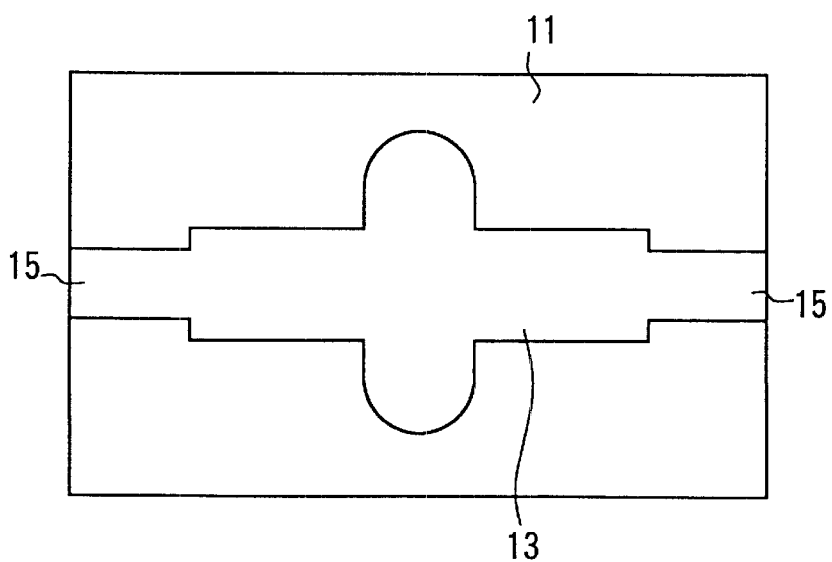
FIG. 8 is a bottom view of the piezoelectric element included in the piezoelectric device shown in FIGS. 4 to 6.

Referring to FIG. 8, the second electrode 13 is provided at the opposing second surface of the piezoelectric substrate 11, facing opposite the two first electrodes 12. In this embodiment, the second electrode 13 also overlaps the capacitor electrode 123 provided at the first surface of the piezoelectric substrate 11 to function as a capacitor electrode as well.

The second electrode 13 is provided with two second lead electrodes 15. Ends of the two second lead electrodes 15, which are electrically continuous with the second electrode 13, are lead out to opposing side end edges of the piezoelectric substrate 11. In this embodiment, the second lead electrodes 15 are lead out to an approximate center of the two side end edges of the piezoelectric substrate 11.

An explanation is given again in reference to FIGS. 4 to 6. A first film structure 2 is provided at the first surface of the piezoelectric substrate 11 to form first cavities 61 and 62 to achieve vibration around the first electrodes 12 and to seal the first cavities 61 and 62. A first hollow layer 21 having a first surface and a second surface, is provided with two first through holes at positions corresponding to those of the first electrodes 12, and the first through holes constitute the first cavities 61 and 62. A first sealing layer 22 constituted as a sheet is formed over the second surface of the first hollow layer 21 to seal the first cavities 61 and 62.

A second film structure 3 is provided at the second surface of the piezoelectric substrate 11 to form second cavities 71 and 72 to achieve vibration around the second electrode 13 and to seal the second cavities 71 and 72. A second hollow layer 31 having a first surface and a second surface, is provided with two second through holes at positions corresponding to those of the second electrode 13, and the second through holes constitute the second cavities 71 and 72. A second sealing layer 32 constituted as a sheet is formed over the second surface of the second hollow layer 21 to seal the second cavities 71 and 72.

As described above, the first hollow layer 21 constituting the first film structure 2 forms the first cavities 61 and 62 around the first electrodes 12. The first sealing layer 22 constituting the first film structure 2, provided over the first hollow layer 21, seals the first cavities 61 and 62. The second hollow layer 31 constituting the second film structure 3 forms the second cavities 71 and 72 around the second electrode 13 facing opposite the first electrodes 12. The second sealing layer 32 constituting the second film structure 3, provided over the second hollow layer 31, seals the second cavities 71 and 72. Thus, piezoelectric vibration is achieved inside the first cavities 61 and 62 and the second cavities 71 and 72 sealed by the first film structure 2 and the second film structure 3 respectively.

The first hollow layer 21 is provided with the first through holes passing through the first hollow layer 21 over a uniform width along the direction of the layer thickness to form the first cavities 61 and 62 constituted of the first through holes around the first electrodes 12. The two first through holes constituting the first cavities 61 and 62 pass through the first hollow layer 21 over a uniform width along the direction of the layer thickness so that the resist resin normally used to form the first cavities 61 and 62 can be completely removed. As a result, a characteristics defect caused by any residual resist resin can be prevented.

The first sealing layer 22 formed as a sheet is deposited on the second surface of the first hollow layer 21 to seal the first cavities 61 and 62. Since such a first sealing layer 22 only needs to be pasted on the plane of the first hollow layer 21, the alignment of the first sealing layer 22 relative to the first hollow layer 21, which is essential in the prior art, is no longer necessary. Thus, no reduction in the degree of airtightness occurs as a result of an erroneous alignment.

Furthermore, since the first sealing layer 22 can be provided simply by pasting it on the plane of the first hollow layer 21, vibration spaces achieving a high degree of airtightness can be formed. Also, by pasting the first sealing layer 22 on the plane of the first hollow layer 21, a sufficient pasting area is assured to achieve vibration spaces, the airtightness of which is not readily reduced.

In addition, the volumetric capacities of the first cavities 61 and 62 (vibration spaces) are set at a constant spatial volume determined by the planar areas of the first through holes provided at the first hollow layer 21 and the layer thickness of the first hollow layer 21. As a result, constant characteristics are assured.

Although a detailed explanation is omitted, it is obvious that the advantages described above in reference to the first film structure 2 are also achieved in the second film structure 3.

A first terminal electrode 41 and a second terminal electrode 42 provided at the base substrate 4 are set on two opposing sides of the insulating substrate 40 and their ends are lead out to the side end edges facing opposite the side end edges where the first lead electrodes 141 and 142 are lead out. The first terminal electrodes 41 and the second terminal electrode 42 are cut off on the surface at which the assembly, which includes the piezoelectric element 1, the first film structure 2 and the second film structure 3, is mounted.

A third terminal electrode 43 is formed on the insulating substrate 40 and has an end lead out to the side end edge facing opposite the side end edge at which the second lead electrode 15 is lead out. In the embodiment, the third terminal electrode 43 assumes a cross-shaped pattern at one surface of the insulating substrate 40 at which the assembly is mounted, with two opposite ends of the third terminal electrode 43 lead out to the two side ends of the insulating substrate 40.

Among connection electrodes 51 to 54, the first connection electrode 51 is formed at a side surface of the assembly and the base substrate 4 to electrically connect an end of the first terminal electrode 41 to an end of the first lead electrode 141. The second connection electrode 52, which is formed at an opposing side surface of the assembly and the base substrate 4, electrically connects an end of the second terminal electrode 42 to an end of the first lead electrode 142. The connection electrodes 53 and 54 electrically connect two ends of the third terminal electrode 43 to the two ends of the second lead electrode 15.

In the case of the piezoelectric device illustrated in FIGS. 4 to 6, too, it becomes unnecessary to provide a through conductor that passes through the piezoelectric substrate 11 along the direction extending from the front to the rear and a land (conductive pattern) for connecting the through conductor, and thus, a piezoelectric device suited for miniaturization is achieved.

Furthermore, by providing the connection electrodes 51 to 54 at positions other than the external soldering areas of the first terminal electrode 41 through third terminal electrode 43, the connection electrodes 51 to 54 are allowed to remain unaffected by the solder applied to the terminal electrodes 41 to 43 for external connection to improve the reliability. In the embodiment illustrated in the figures, the connection electrodes 51 to 54 are formed at side surfaces offset by approximately 90° from the side surface at which the surfaces of the first terminal electrode 41 through third terminal electrode 43 emerge among the four sides surfaces of the insulating substrate 40 and, as a result, no solder travels around to the first and second connection electrodes 51 and 52 when the first terminal electrode 41 through third terminal electrode 43 are soldered on a circuit board.

In addition, since the connection electrodes 51 to 54, which are allowed to remain unaffected by the solder applied to the terminal electrodes for external connection, can be constituted of a conductive material that is different from the material constituting the first through third terminal electrodes 41 to 43, e.g., a thin film. The first through third terminal electrodes 41 to 43 may each adopt a plated film structure constituted of a plurality of layers achieved by taking into consideration adhesion to the base substrate 4 and the solderability characteristics and, as a result, a piezoelectric device achieving outstanding solderability is obtained.

Embodiments in Second Mode

Figure 9:
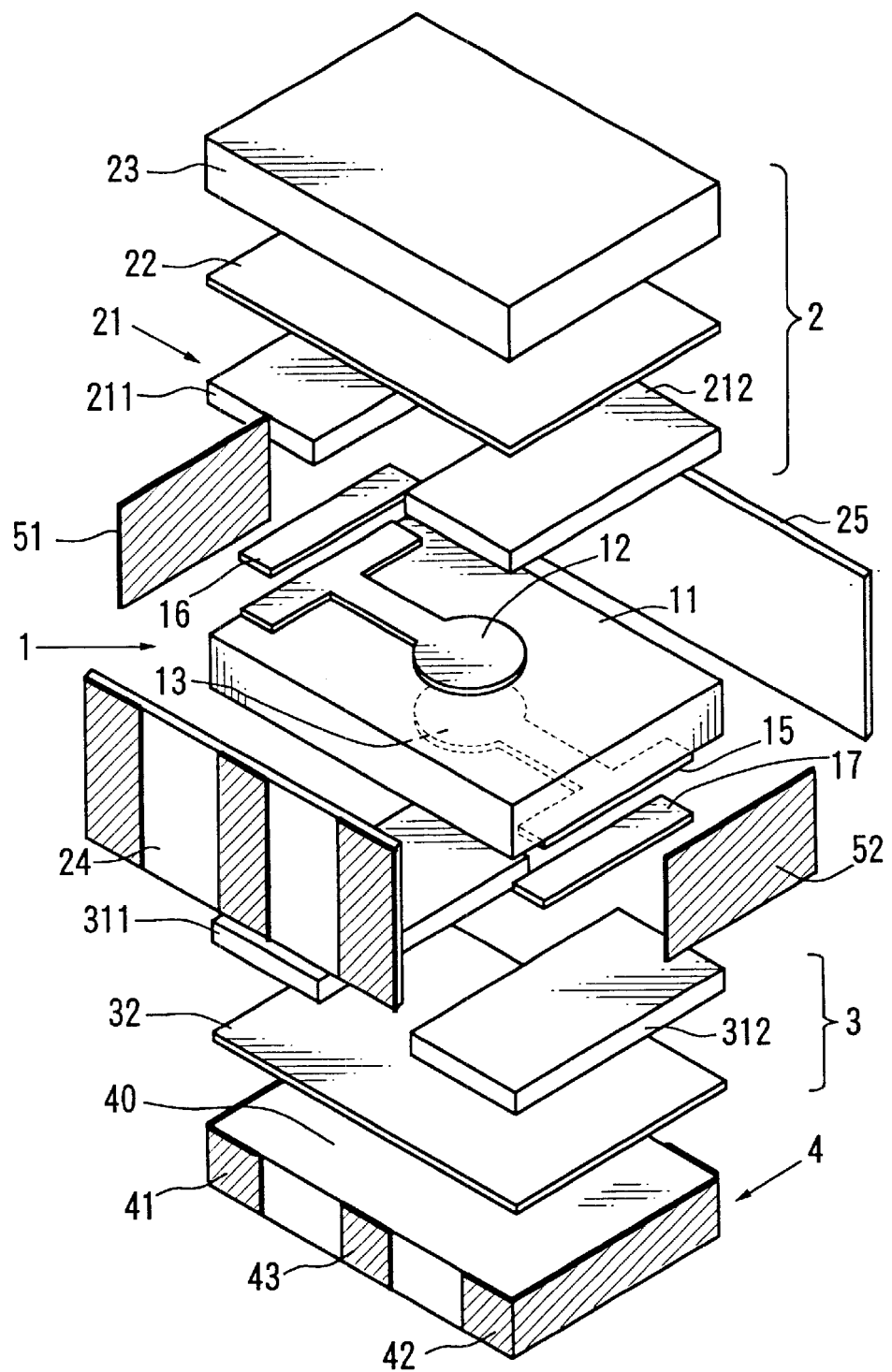
FIG. 9 is an exploded perspective illustrating a piezoelectric device adopting the second mode of the present invention.
Figure 10:
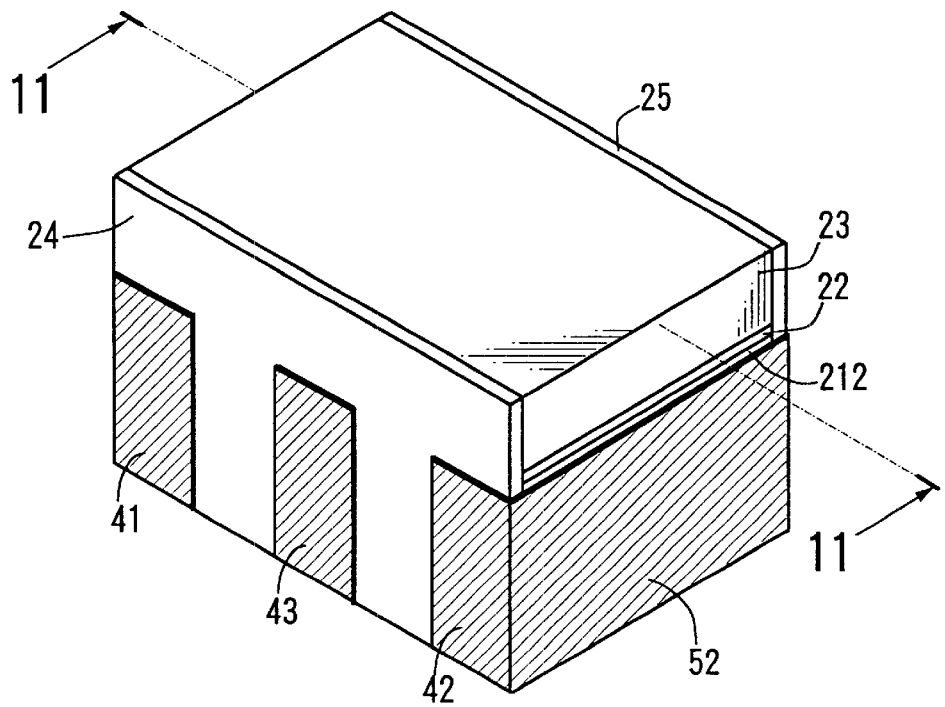
FIG. 10 is a perspective of the piezoelectric device shown in FIG. 9 in an assembled state.
Figure 11:
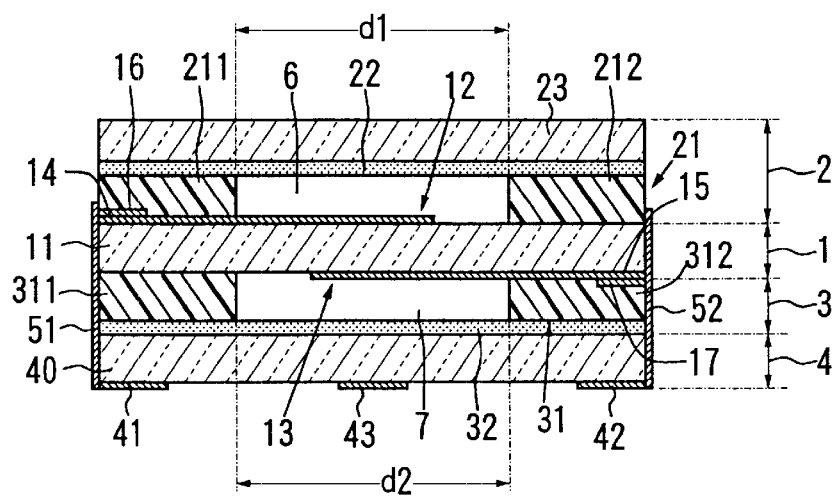
FIG. 11 is a sectional view taken along line 11—11 in FIG. 10.

Referring to FIGS. 9 to 11, the piezoelectric device adopting the second mode includes a piezoelectric element 10, a first film structure 2, a second film structure 3 and a third film structure including third and fourth sealing layers 24 and 25.

The piezoelectric element 1 includes a piezoelectric substrate 11, a first electrode 12 and a second electrode 13. The first electrode 12 is provided at a first surface of the piezoelectric substrate 11. The second electrode 13, which is provided at a second surface of the piezoelectric substrate 11, faces opposite the first electrode 12.

The first film structure 2 includes a first hollow layer 21 and a first sealing layer 22. The first hollow layer 21 includes first split layers 211 and 212 provided over a distance d1 from each other. The first split layers 211 and 212 are provided at the first surface of the piezoelectric substrate 11 to form a first cavity 6 ranging over the distance d1 around a vibration portion that includes the first electrode 12. The first sealing layer 22, which is constituted as a sheet, is formed astride the first split layers 211 and 212 constituting the first hollow layer 21.

The second film structure 3 includes a second hollow layer 31 and a second sealing layer 32. The second hollow layer 31 includes second split layers 311 and 312 provided over a distance d2 from each other. The second split layers 311 and 312 are provided at the second surface of the piezoelectric substrate 11 to form a second cavity 7 ranging over the distance d2 around a vibration portion that includes the second electrode 13. The second sealing layer 32, is formed astride the second split layers 311 and 312 constituting the second hollow layer 31.

The third film structure includes third and fourth sealing layers 24 and 25 which are formed at the two side surfaces of the assembly which includes the piezoelectric element 1, the first film structure 2 and the second film structure 3 to seal the first cavity 6 and the second cavity 7 at the two side surfaces.

In the piezoelectric device adopting the second mode, the first electrode 12 is provided at the first surface of the piezoelectric substrate 11. The second electrode 13 is provided at the second surface of the piezoelectric substrate 11 to face opposite the first electrode 12. The first electrode 12 and the second electrode 13 each constitute a vibration portion. As a result, piezoelectric vibration characteristics determined by the first electrode 12 and the second electrode 13 are achieved.

The first hollow layer 21 constituting the first film structure 2 forms the first cavity 6 around the first electrodes 12. The first sealing layer 22 has a first surface and a second surface, and is formed over the first hollow layer 21. The second hollow layer 31 constituting the second film structure 3 forms the second cavity 7 around the first electrode 12. The second sealing layer 32 has a first surface and a second surface, and is formed over the second hollow layer 31. The third film structure including third and fourth sealing layers 24 and 25 are formed at the two side surfaces of the assembly which includes the piezoelectric element 1, the first film structure 2 and the second film structure 3 to seal the first cavity 6 and the second cavity 7 at the two side surfaces. Thus, the piezoelectric element 1 engages in piezoelectric vibration inside the first cavity 6 and the second cavity 7 sealed by the first film structure 2, the second film structure 3 and the third film structure including third and fourth sealing layers 24 and 25.

The first hollow layer 21 constituting the first film structure 2 includes the first split layers 211 and 212 set over the distance d1 from each other, and the first split layers 211 and 212 are provided at the first surface of the piezoelectric substrate 11 to form the first cavity 6 ranging over the distance d1 around the first electrode 12, thereby precluding the need for a resist resin which is normally used to form the first cavity 6. Thus, a characteristics defect caused by residual resist resin is prevented. However, when a resist resin is used to form the first cavity 6, the resist resin can be completely removed by passing it through the gap which is formed between the first split layers 211 and 212, thus preventing a characteristics defect caused by residual resist resin.

The first sealing layer 22 constituting the first film structure 2 is formed astride the first split layers 211 and 212 constituting the first hollow layer 21. Since such a first sealing layer 22 only needs to be pasted on the plane of the first split layers 211 and 212, the process of aligning the first sealing layer 22 relative to the first hollow layer 21, which is crucial in the prior art, can be eliminated. As a result, no reduction in the degree of airtightness occurs due to an erroneous alignment.

Furthermore, since the first sealing layer 22 only needs to be pasted on the plane of the first split layers 211 and 212 constituting the first hollow layer 21, a vibration space achieving a high degree of airtightness can be formed. In addition, since a sufficient pasting area is assured by pasting the first sealing layer 22 on the plane of the two split layers 211 and 212 constituting the first hollow layer 21, a vibration space, the airtightness of which is not readily reduced, is achieved.

The first sealing layer 22 may be formed by a means such as screen printing as well. In such a case, too, since the first sealing layer 22 only needs to be formed on the plane of the first hollow layer 21, the process of aligning the first sealing layer 22 relative to the first hollow layer 21, which is crucial in the prior art, can be eliminated. Thus, a reduction in the degree of airtightness attributable to an erroneous alignment does not occur.

The volumetric capacity of the first cavity 6 (vibration space) is set at a constant spatial volume determined by the planar area of the gap ranging over the distance d1 formed between the first split layers 211 and 212 and the layer thicknesses of the first split layers 211 and 212. As a result, constant characteristics can be assured.

Advantages similar to those explained in reference to the first film structure 2 are realized in the second film structure 3.

The first cavity 6 formed by the first film structure 2 and the second cavity 7 formed by the second film structure 3 are sealed by the third film structure which include the third and fourth sealing layers 24 and 25. Since the third and fourth sealing layers 24 and 25 constituting the third film structure are formed at the two side surfaces of the assembly which includes the piezoelectric element 1, the first film structure 2 and the second film structure 3, a sufficient bonding or pasting area is assured. Consequently, a vibration space, the airtightness of which is not readily reduced, is achieved. In addition, since the third and fourth sealing layers 24 and 25 constituting the third film structure are formed at the two side surfaces, the volumetric capacities of the first cavity 6 and the second cavity 7 do not fluctuate. The volumetric capacities of the first cavity 6 and the second cavity 7 are set to constant spatial volumes determined by the planar areas of the gaps ranging over the distances d1 and d2 formed respectively between the first split layers 211 and 212 and between the second split layers 311 and 312 and the layer thicknesses of the split layers (211, 212) and (311, 312). Thus, constant characteristics can be assured.

Next, methods of manufacturing the piezoelectric device according to the present invention is explained.

Methods of Manufacturing Piezoelectric Device in First Mode

Figure 12:
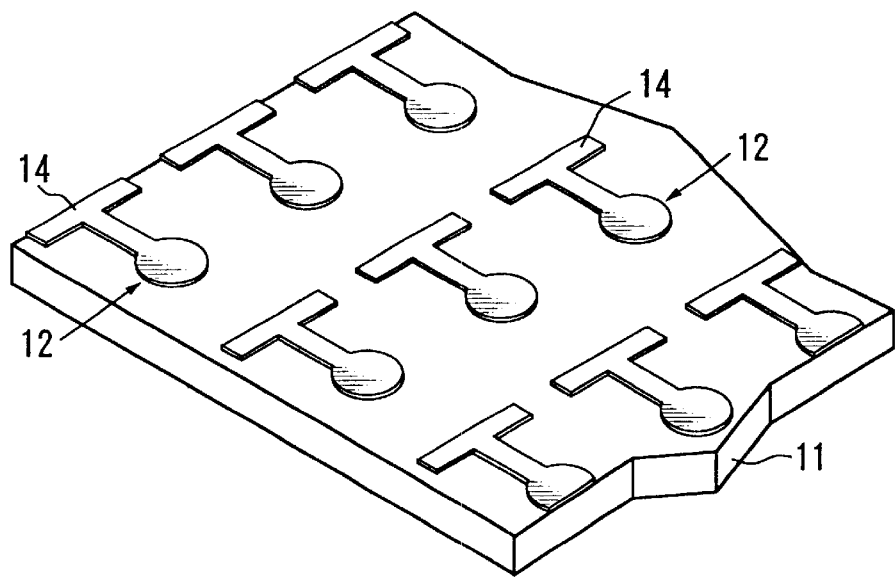
FIG. 12 is a perspective illustrating a step implemented to manufacture the piezoelectric device adopting the first mode.

Referring to FIGS. 12 to 30, the manufacturing steps implemented to manufacture the piezoelectric device adopting the first mode are explained. First, as illustrated in FIG. 12, numerous first electrodes 12 are formed in a specific pattern on a large wafer-type piezoelectric substrate 11. The first electrodes 12 may be formed through a high-precision pattern forming technology by implementing photolithography or they may be formed through screen printing or the like. The first electrodes 12 are each formed in a pattern having a first lead electrode 14.

Figure 13:
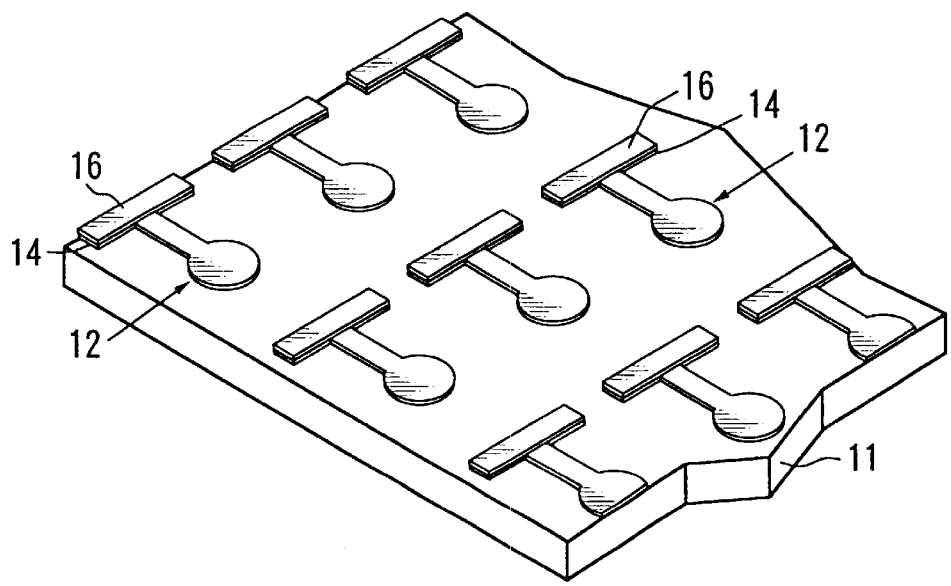
FIG. 13 is a perspective illustrating a manufacturing step implemented after the step shown in FIG. 12.

Next, as illustrated in FIG. 13, end electrodes 16 constituted of an electrode material similar to that used to constitute the first electrodes 12 are laminated onto an end of each first lead electrode 14.

Figure 14:
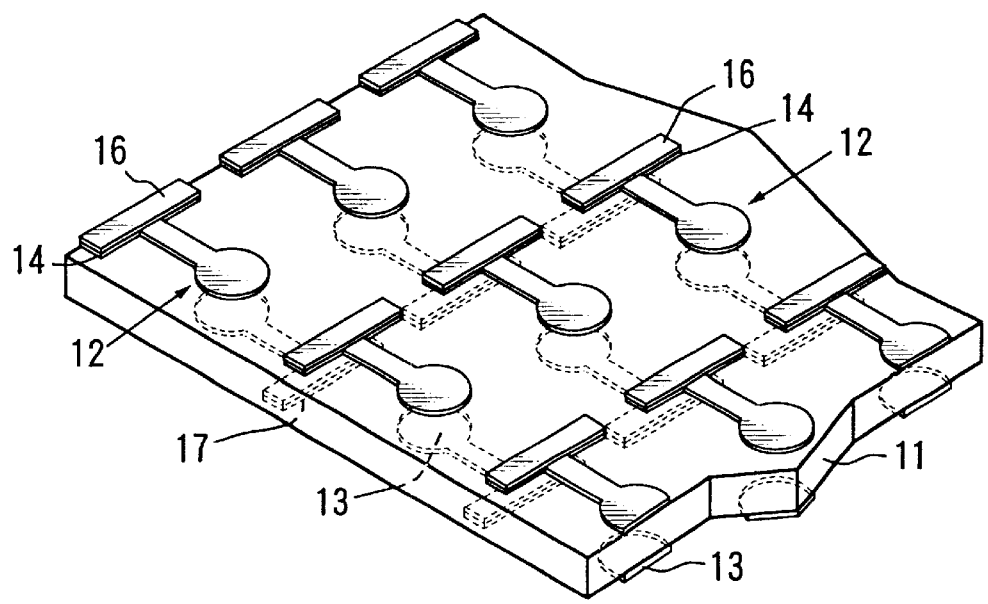
FIG. 14 is a perspective illustrating a manufacturing step implemented after the step shown in FIG. 13.
Figure 15:
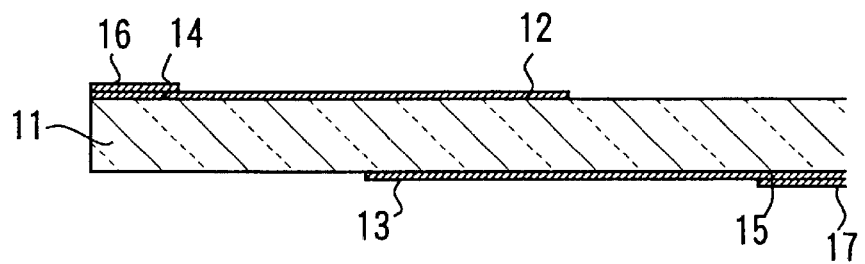
FIG. 15 is a sectional view illustrating the step shown in FIG. 14 in an enlargement.

Similar steps are executed at the second surface of the piezoelectric substrate 11. In FIGS. 14 and 15, which illustrate the wafer-type piezoelectric substrate 11 thus formed, the first electrodes 12 and the first lead electrodes 14 are formed at the first surface of the piezoelectric substrate 11 with second electrodes 13 and second lead electrodes 15 formed at the second surface of the piezoelectric substrate 11.

Figure 16:
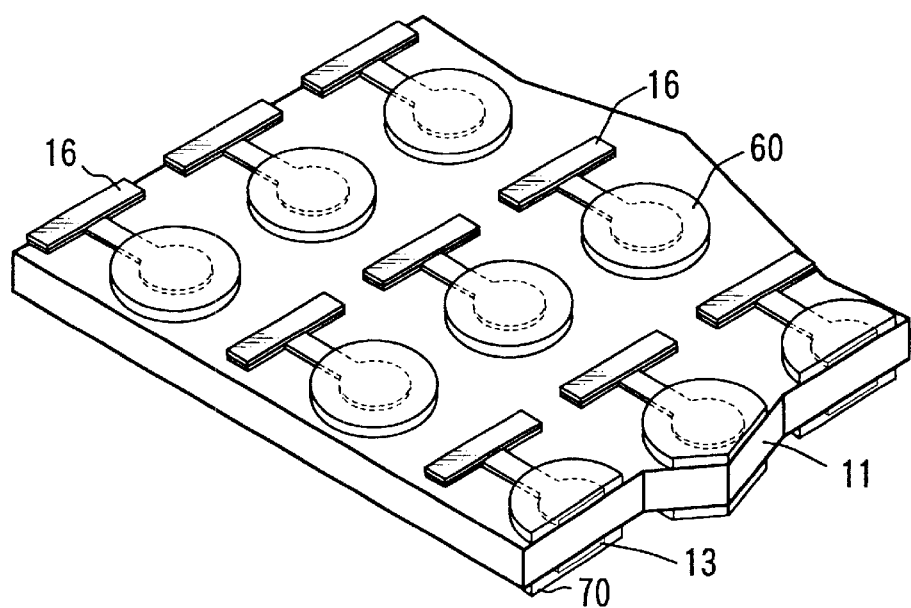
FIG. 16 is a perspective illustrating a manufacturing step implemented after the step shown in FIGS. 14 and 15.
Figure 17:
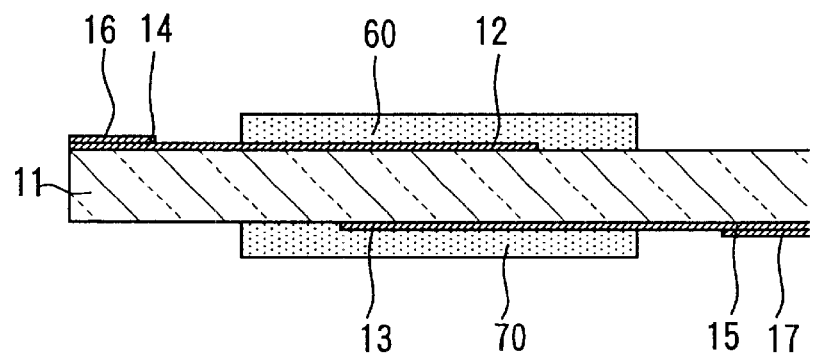
FIG. 17 is a sectional view illustrating the step shown in FIG. 16 in an enlargement.

Next, as illustrated in FIGS. 16 and 17, resist resins 60 and 70 are applied individually to cover the first electrodes 12 and the second electrodes 13 over ranges larger than their external diameters, and are dried. The resist resins 60 and 70 should be constituted of a material that can be easily dissolved and removed using water, or an alkaline or organic solvent.

Figure 18:
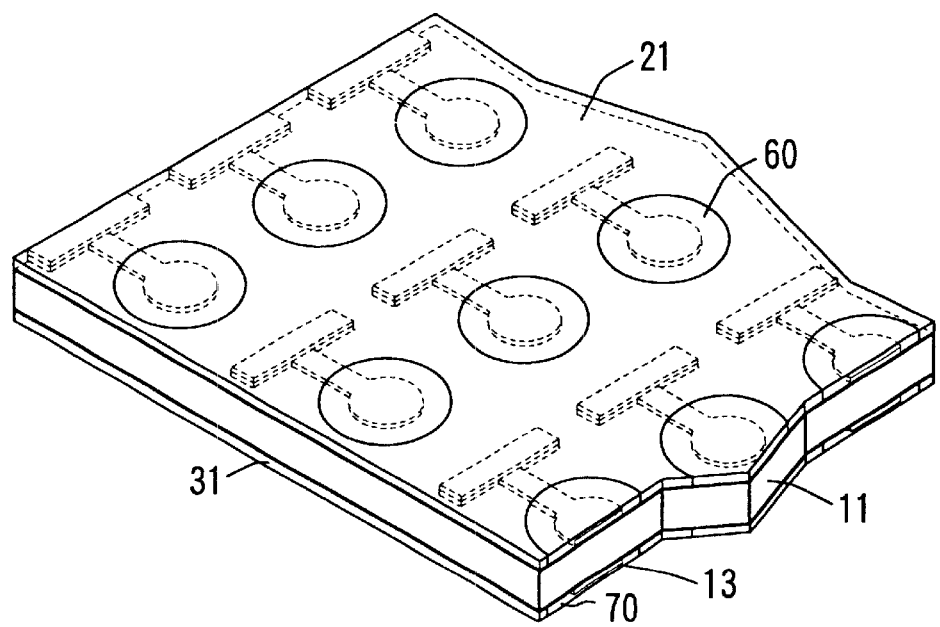
FIG. 18 is a perspective illustrating a manufacturing step implemented after the step shown in FIGS. 16 and 17.
Figure 19:
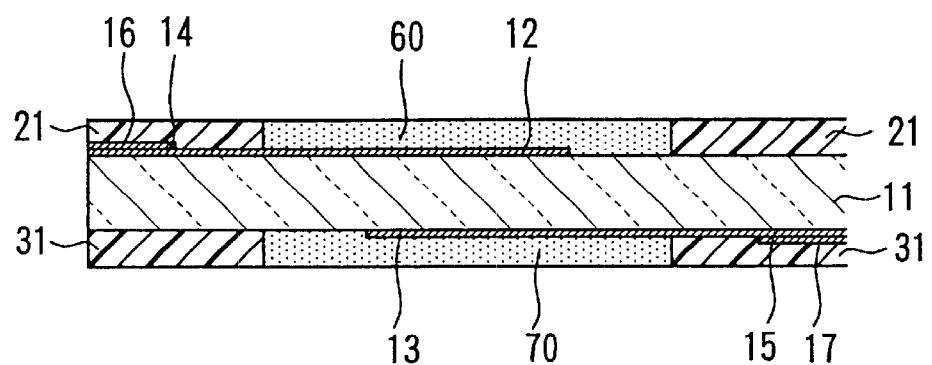
FIG. 19 is a sectional view illustrating the step shown in FIG. 18 in an enlargement.

Next, as illustrated in FIGS. 18 and 19, resins 21 and 31 are applied to fill the areas of the first surface and the second surface of the wafer-type piezoelectric substrate 11 where the resist resins 60 and 70 are not present and are dried and set. The resins 21 and 31 constitute the first and second hollow layers 21 and 31 (see FIGS. 1 to 3).

Figure 20:
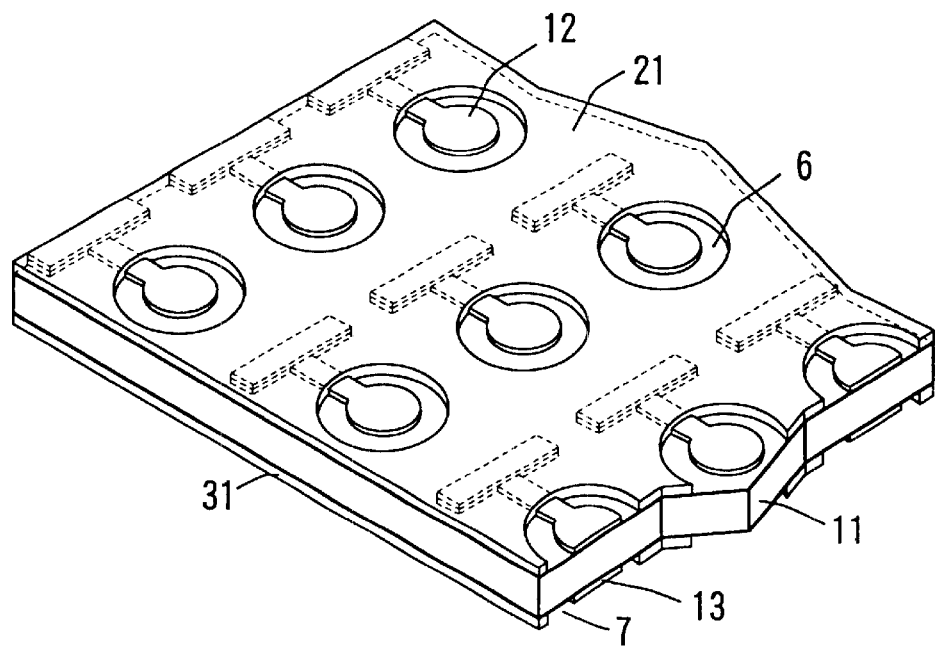
FIG. 20 is a perspective illustrating a manufacturing step implemented after the step shown in FIGS. 18 and 19.
Figure 21:
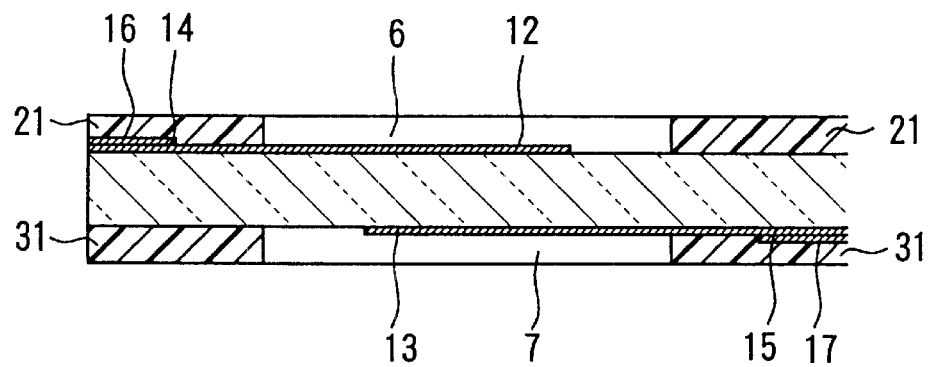
FIG. 21 is a sectional view illustrating the step shown in FIG. 20 in an enlargement.

Then, as illustrated in FIGS. 20 and 21, the resist resins 60 and 70 are removed. The resist resins 60 and 70 can be easily dissolved and removed using water or an alkaline or organic solvent as explained earlier. When the resist resins 60 and 70 are removed, spaces 6 and 7 to respectively constitute the first cavities 6 and second cavities 7 are created. Since the first through holes to constitute the first cavities 6 and the second through holes to constitute the second cavities 7 pass through the first hollow layer 21 and the second hollow layer 31 over a uniform width along the direction of the layer thickness, the resist resins 60 and 70 can be expunged along the direction on the plane of the first hollow layer 21 and the second hollow layer 31 for complete removal. As a result, a characteristics defect caused by residue of the resist resins 60 and 70 can be prevented.

Figure 22:
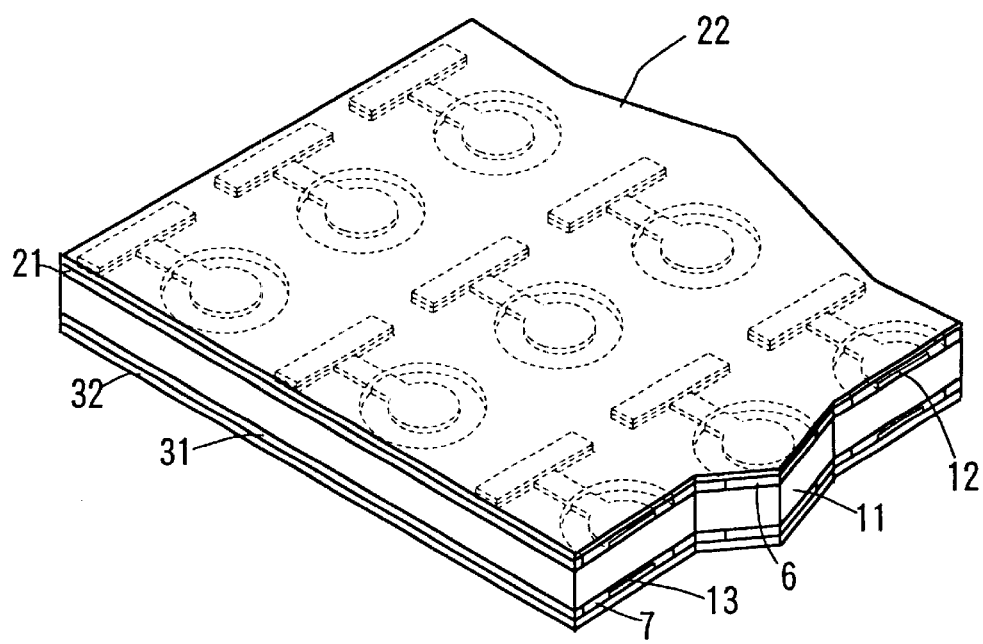
FIG. 22 is a perspective illustrating a manufacturing step implemented after the step shown in FIGS. 20 and 21.
Figure 23:
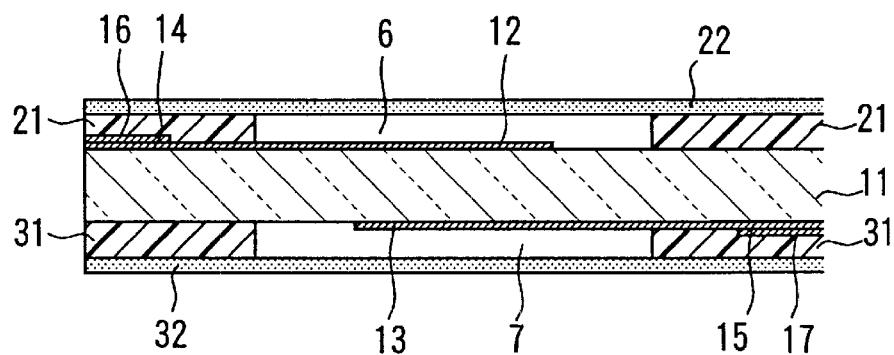
FIG. 23 is a sectional view illustrating the step shown in FIG. 22 in an enlargement.

Next, as illustrated in FIGS. 22 and 23, the first sealing layer 22 and the second sealing layer 32 are laminated. Layers constituted as sheets may be pasted or layers may be formed through screen printing as a means for lamination. Thus, an assembly that includes the wafertype piezoelectric substrate 11, the first sealing layer 22 and the second sealing layer 32 is achieved. Since the first and second sealing layers 22 and 32 can each be formed on the plane of either the first hollow layer 21 or the second hollow layer 31, of the process of aligning the first and second sealing layers 22 and 32 relative to the first and second hollow layers 21 and 31, which is crucial in the prior art, can be eliminated. Consequently, no reduction in the degree of airtightness attributable to an erroneous alignment occurs.

Furthermore, since the first and second sealing layers 22 and 32 only need to be formed on the planes the first and second hollow layers 21 and 31, vibration spaces achieving a high degree of airtightness are formed. In addition, since a sufficient lamination area is assured by laminating the first and second sealing layers 22 and 32 on the planes of the first and second hollow layers 21 and 31, vibration spaces the airtightness of which is not readily reduced are achieved.

Moreover, since the volumetric capacities of the first and second cavities 6 and 7 are set at constant spatial volumes determined by the planar areas of the first and second through holes provided at the first and second hollow layers 21 and 31 and the layer thicknesses of the first and second hollow layers 21 and 31, constant characteristics can be assured.

Figure 24:
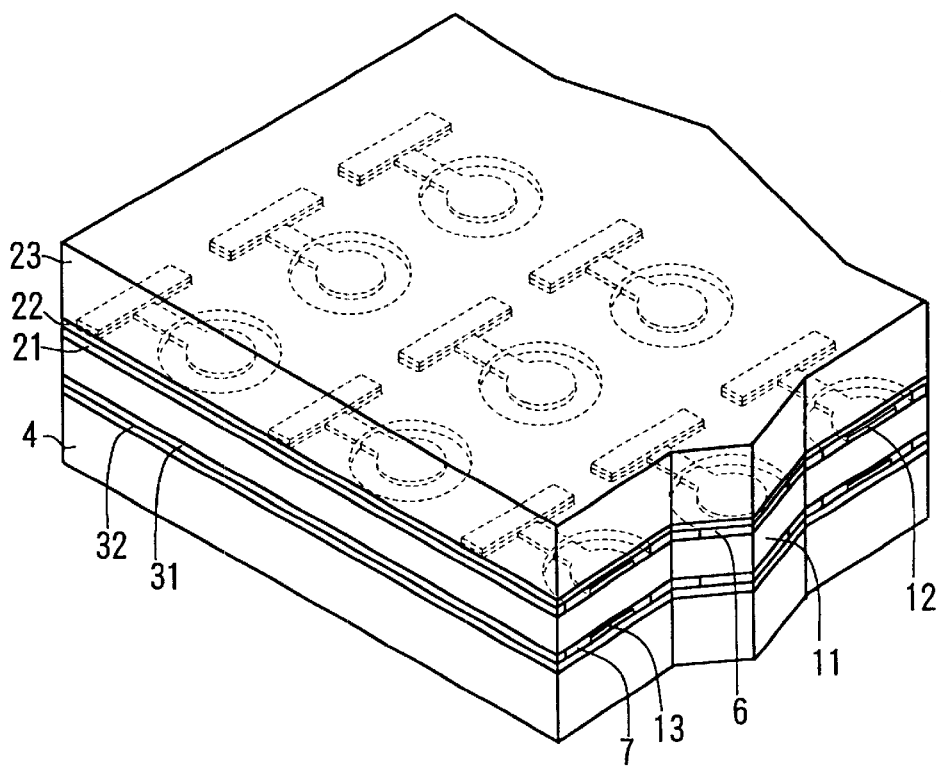
FIG. 24 is a perspective illustrating a manufacturing step implemented after the step shown in FIGS. 22 and 23.
Figure 25:
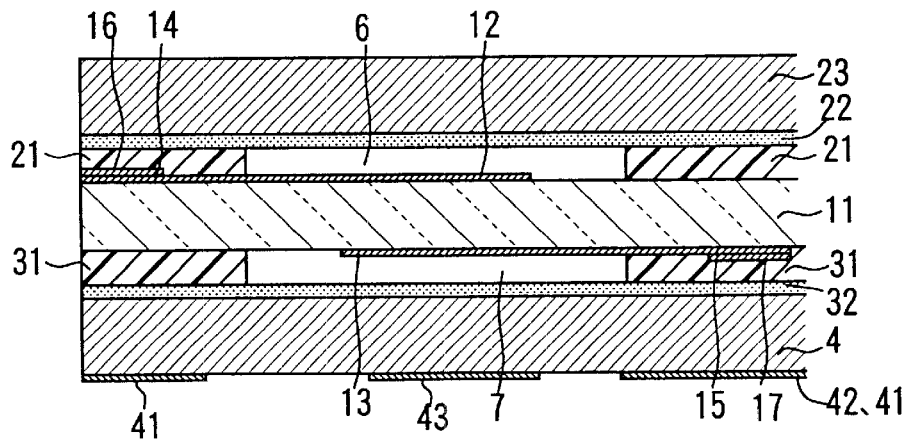
FIG. 25 is a sectional view illustrating the step shown in FIG. 24 in an enlargement.

Then, as illustrated in FIGS. 24 and 25, the base substrate 4 is bonded to the second sealing layer 32 and the top plate 23 is bonded to the first sealing layer 22. The base substrate 4 and the top plate 23 may be bonded by taking advantage of the adhesive force achieved by the second sealing layer 32 and the first sealing layer 22 or by taking advantage of the adhesive force of the bonding layers provided at the first surfaces of the second sealing layer 32 and the first sealing layer 22.

The base substrate 4 is manufactured through a process implemented separately from the process of manufacturing assemblies each comprising the piezoelectric element 1, the first film structure 2 and the second film structure 3. It is desirable to form first terminal electrodes 41, second terminal electrodes 42 and third terminal electrodes 43 in strips at the bottom surface of the base substrate 4. The first terminal electrode 41 of one piezoelectric element and the second terminal electrode 42 of an adjacent piezoelectric element are formed as an integrated unit.

Figure 26:
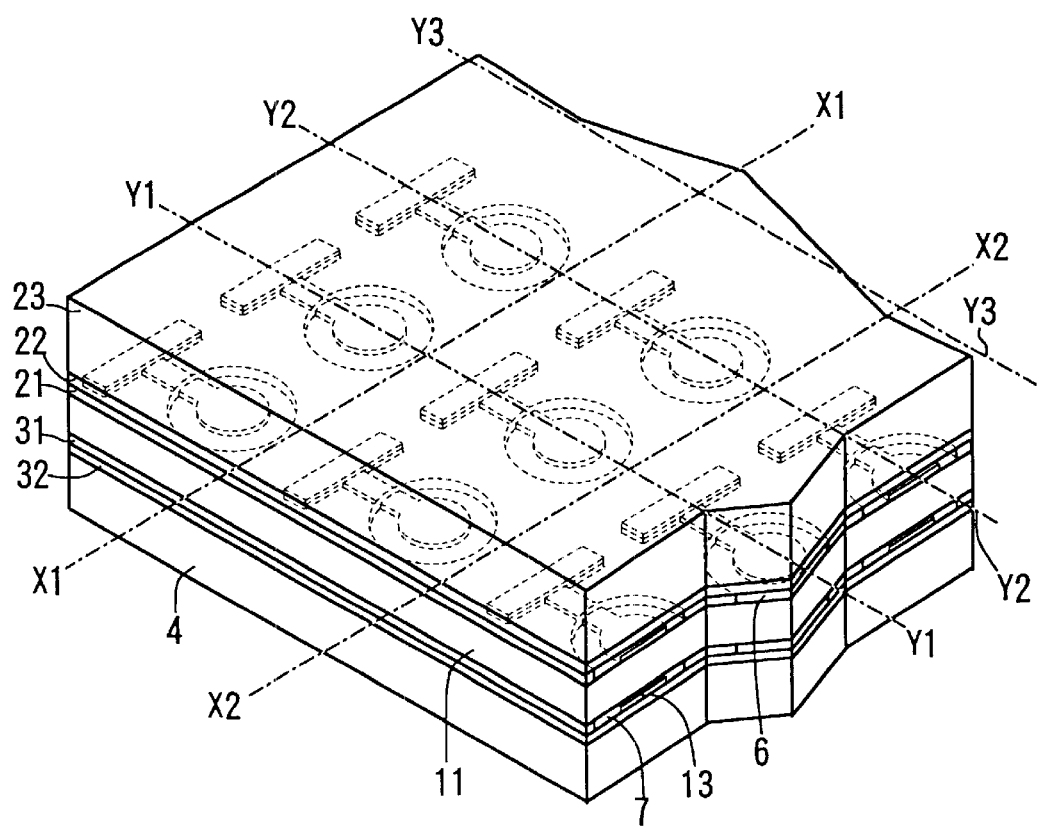
FIG. 26 is a perspective illustrating a manufacturing step implemented after the step shown in FIGS. 24 and 25.
Figure 27:
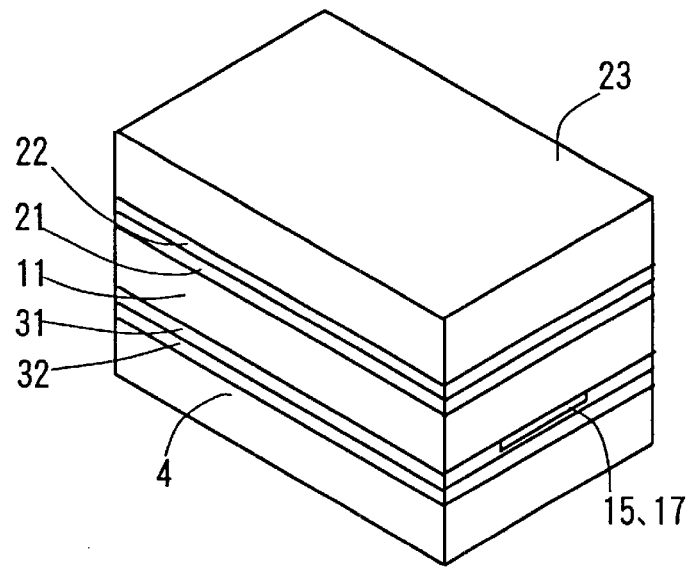
FIG. 27 is a perspective of a piezoelectric device (unfinished) obtained through the cutting step illustrated in FIG. 26.

Then, as illustrated in FIG. 26, the assembly that includes the base substrate 4, the wafer-type piezoelectric substrate 11, the first hollow layer 21, the first sealing layer 22, the second hollow layer 31, the second sealing layer 32 and the top plate 23 is cut along line X1—X1, line X2—X2 and line Y1—Y1 to line Y3—Y3. A dicing saw may be utilized as a means for cutting. After this cutting step, individual piezoelectric devices, as shown in FIG. 27, are obtained.

Next, the first terminal electrode 41, the second terminal electrode 42, the third terminal electrode 43 and the first and second connection electrodes 51 and 52 are formed at side surfaces of the individual assemblies. Thus, an end of the first terminal electrode 41 is electrically connected to an end of the first lead electrode 14 and an end of the second terminal electrode 42 is electrically connected to an end of the second lead electrode 15 (see FIGS. 1 to 3). The first terminal electrode 41 through third terminal electrode 43 and the connection electrodes 51 and 52 may each be formed by plating a thin film formed by a means for thin film formation such as sputtering.

Figure 29:
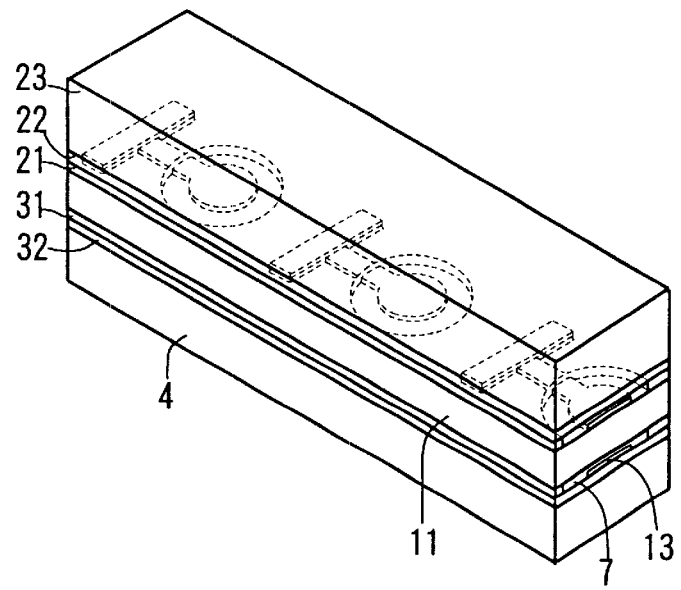
FIG. 29 is a perspective illustrating another cutting method.

FIG. 29 illustrates another efficient cutting method that may be adopted. In FIG. 29, the assembly that includes the base substrate 4, the wafer-type piezoelectric substrate 11, the first hollow layer 21, the first sealing layer 22, the second hollow layer 31, the second sealing layer 32 and the top plate 23 is cut along line Y1—Y1, line Y2—Y2, line Y3—Y3, ... in FIG. 26 to obtain rectangular assemblies, each having a plurality of sets of electrodes each constituted of a first electrode and a second electrode arrayed in a single row.

Figure 28:
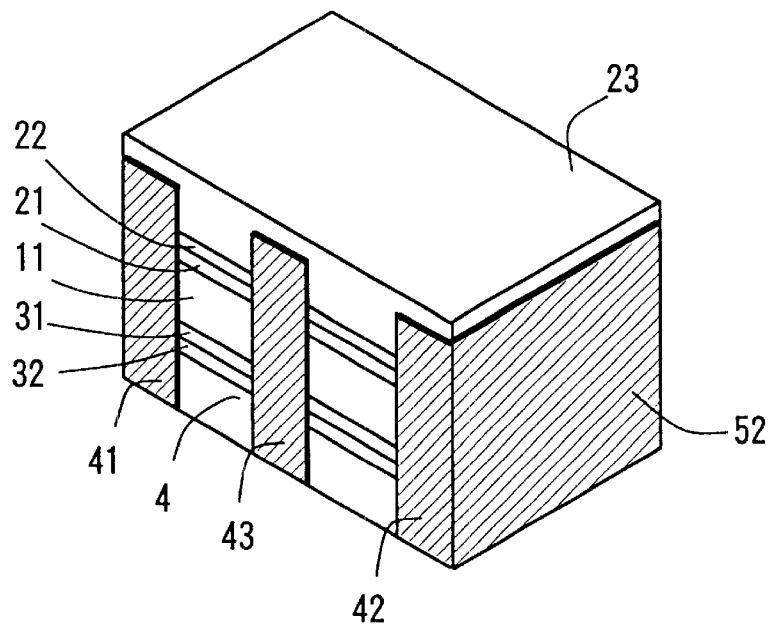
FIG. 28 is a perspective of a piezoelectric device (finished) obtained by forming electrodes at the piezoelectric device (unfinished) shown in FIG. 27.
Figure 30:
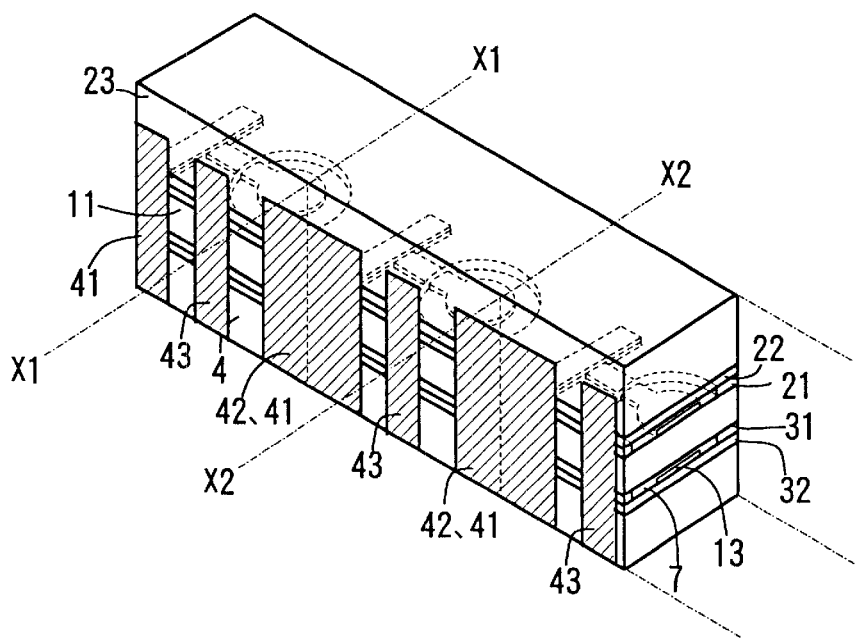
FIG. 30 is a perspective illustrating a manufacturing step implemented after the step shown in FIG. 29.

Next, as illustrated in FIG. 30, first terminal electrodes 41, second terminal electrodes 42 and third terminal electrodes 43 are formed at a side surface of each rectangular assembly. Then, the rectangular assembly is cut along line X1—X1 and line X2—X2 in FIG. 30. In the next step, the first and second connection electrodes 51 and 52 are formed at the cut surfaces, as shown in FIG. 28. Thus, an end of the first terminal electrode 41 is electrically connected with an end of the first lead electrode 14 and an end of the second terminal electrode 42 is electrically connected to an end of the second lead electrode 15 (see FIGS. 1 to 3). By adopting the manufacturing method illustrated in FIGS. 29 and 30, the first terminal electrodes 41 through third terminal electrodes 43 can be formed all at the same time for a plurality of piezoelectric elements contained in each rectangular assembly to improve the efficiency of the terminal electrode formation process.

Although not shown, the piezoelectric device illustrated in FIGS. 4 to 6, too, can be manufactured through similar processes. It is obvious that the patterns of the first electrodes and the second electrodes, the number of connection electrodes, the pattern of the terminal electrodes and the like must be changed to manufacture the piezoelectric device in FIGS. 4 to 6.

Methods of Manufacturing Piezoelectric Device in Second Mode

Referring to FIGS. 31 to 48, the manufacturing steps implemented to manufacture the piezoelectric device adopting the second mode are explained. In the method of manufacturing the piezoelectric device in the second mode, too, the manufacturing steps illustrated in FIGS. 12 to 15 are implemented to form first electrodes 12, second electrodes 13, first lead electrodes 14, second lead electrode 15 and end electrodes 16 and 17 on a wafer-type piezoelectric substrate 11. When the electrode formation steps are completed, a first film structure formation process, a second film structure formation process and a third film structure formation process are implemented.

Figure 31:
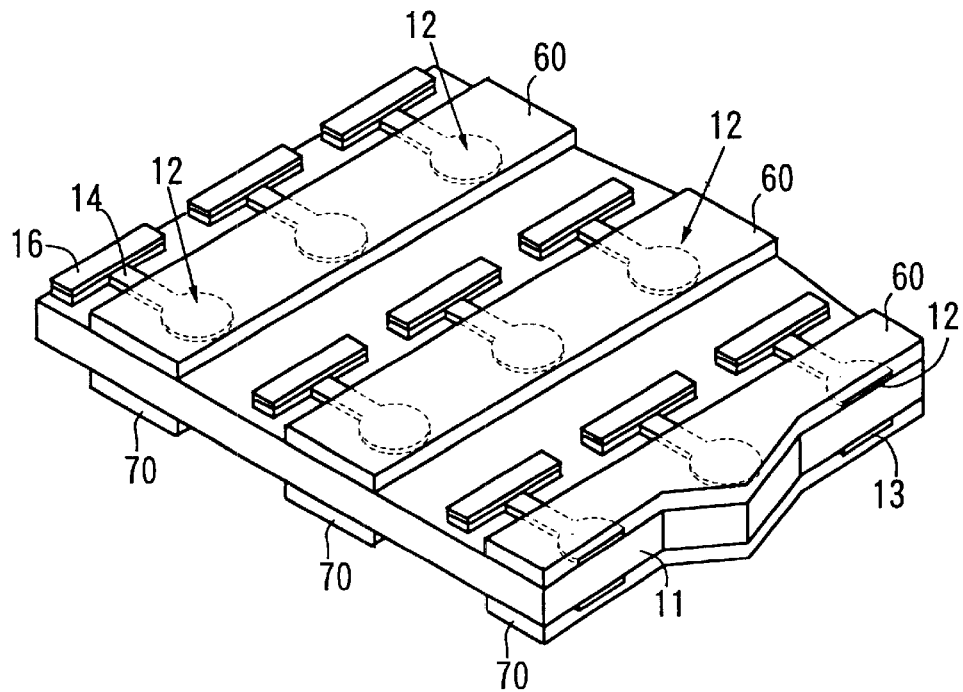
FIG. 31 is a perspective illustrating a step implemented to manufacture the piezoelectric device adopting the second mode.
Figure 32:
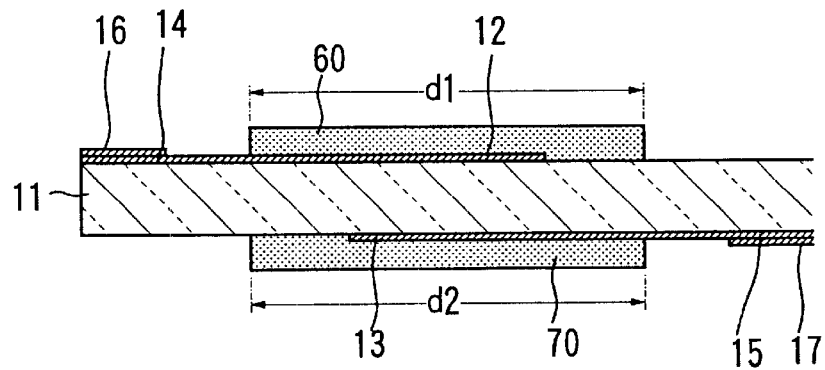
FIG. 32 is a sectional view illustrating the step shown in FIG. 31 in an enlargement.

In the first film structure formation process, a first resist resin 60 is applied onto the first surface of the wafer-type piezoelectric substrate 11 in strips each having a width d1 to cover a plurality of first electrodes 12 together, as illustrated in FIGS. 31 and 32.

In the second film structure formation process, too, a second resist resin 70 is applied onto the second surface of the piezoelectric substrate 11 in strips, each having a width d2 to cover a plurality of second electrodes 13 together.

Figure 33:
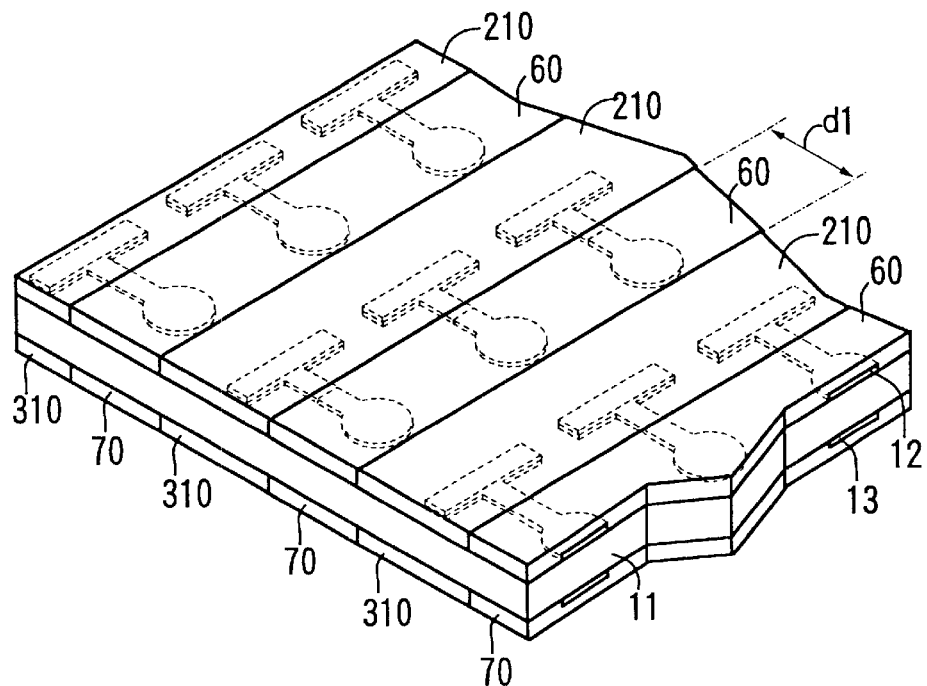
FIG. 33 is a perspective illustrating a manufacturing step implemented after the step shown in FIGS. 31 and 32.
Figure 34:
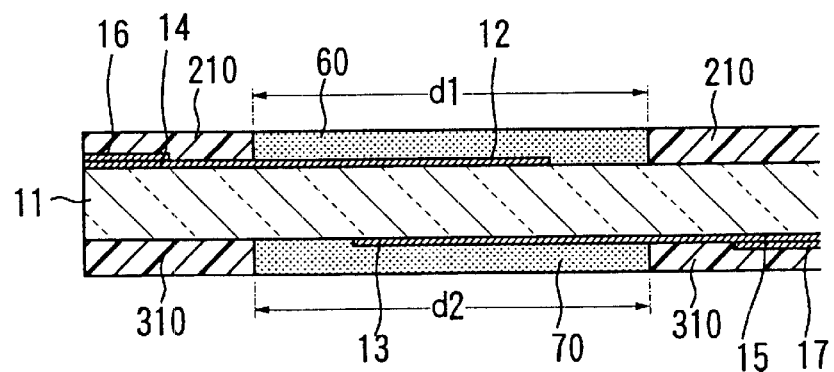
FIG. 34 is a sectional view illustrating the step shown in FIG. 33 in an enlargement.

Next, as illustrated in FIGS. 33 and 34, a first resin layer 210 is formed at the first surface of the piezoelectric substrate 11 around the first resist resin 60. In addition, a second resin layer 310 is formed at the second surface of the piezoelectric substrate 11 around the second resist resin 70.

Figure 35:
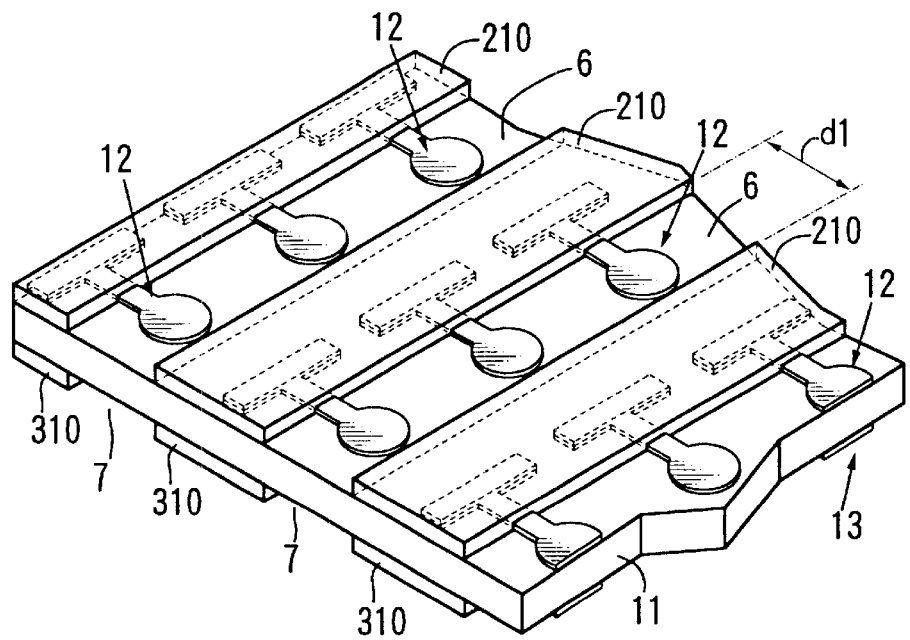
FIG. 35 is a perspective illustrating a manufacturing step implemented after the step shown in FIGS. 33 and 34.
Figure 36:
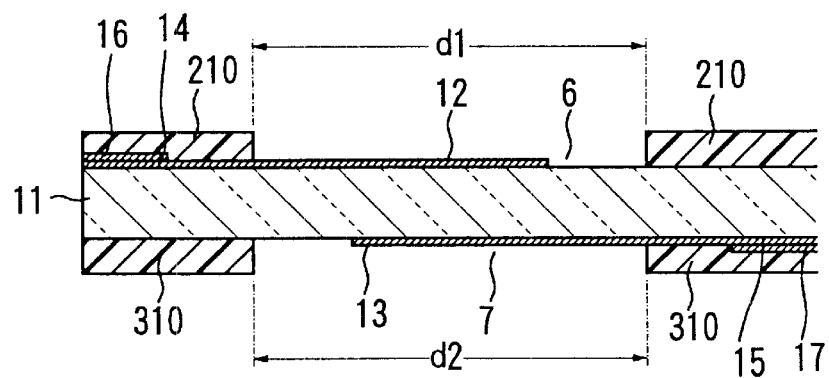
FIG. 36 is a sectional view illustrating the step shown in FIG. 35 in an enlargement.

Then, as illustrated in FIGS. 35 and 36, the first resist resin 60 is removed at the first surface of the piezoelectric substrate 11 to form first through holes 6 each containing a plurality of first electrodes 12. At the second surface of the piezoelectric substrate 11, the second resist resin 70 is removed to form second through holes 7 each containing a plurality of second electrodes 13. The resist resins 60 and 70 can be easily dissolved and removed using water, or an alkaline or organic solvent as explained earlier. When the resist resins 60 and 70 are removed, the first and second through holes 6 and 7 to constitute first cavities and second cavities are created. The resist resins 60 and 70, which are expunged along three directions, i.e., along the first surface, along the second surface and along the side surface are thoroughly removed. Thus, a characteristics defect caused by residue of the resist resins 60 and 70 can be prevented.

Figure 37:
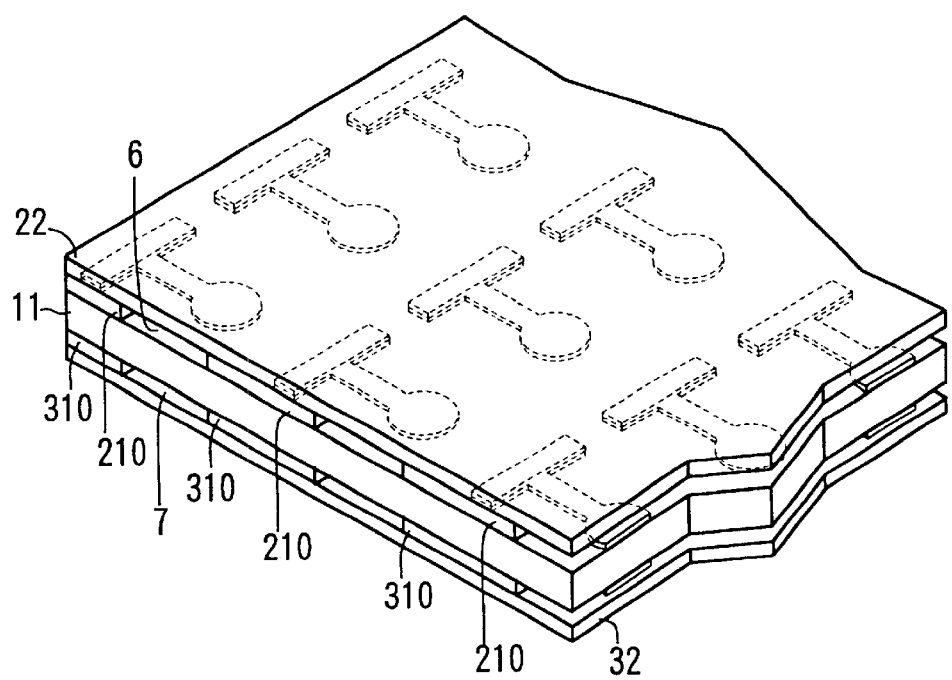
FIG. 37 is a perspective illustrating a manufacturing step implemented after the step shown in FIGS. 35 and 36.
Figure 38:
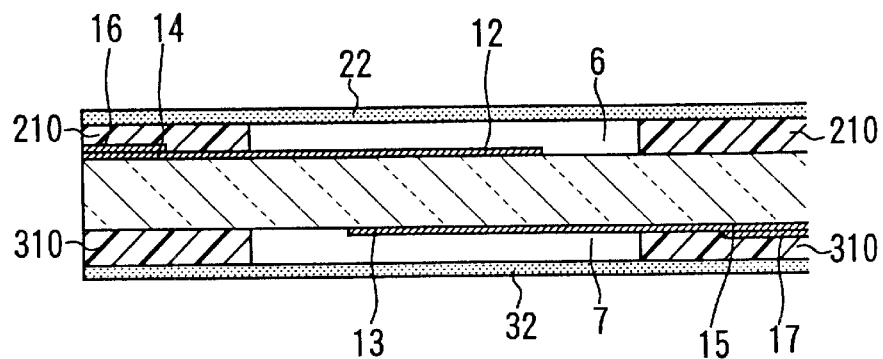
FIG. 38 is a sectional view illustrating the step shown in FIG. 37 in an enlargement.

Then, as illustrated in FIGS. 37 and 38, the first sealing layer 22 is formed over the first resin layer 210 as a follow-up step in the first film structure formation process, and the second sealing layer 32 is formed over the second resin layer 310 as a follow-up step in the second film structure formation process. The first sealing layer 22, constituted as a sheet, is formed astride the first split layers 211 and 212 constituting the first hollow layer 21. Since the first sealing layer 22 only needs to be pasted on the plane of each of the first split layers 211 and 212, the process of aligning the first sealing layer 22 relative to the first hollow layer 21, which is crucial in the prior art, can be eliminated. As a result, no reduction in the degree of airtightness attributable to an erroneous alignment occurs. A similar advantage is achieved at the second sealing layer 32, as well.

Furthermore, since the first sealing layer 22 only needs to be pasted on the plane of the first split layers 211 and 212 constituting the first hollow layer 21, vibration spaces achieving a high degree of airtightness are formed. In addition, since a sufficient pasting area is assured by pasting the first sealing layer 22 to the first hollow layer 21 on the planes of the first split layers 211 and 212 constituting the first hollow layer 21, vibration spaces the airtightness of which is not readily reduced are achieved. A similar advantage is achieved at the second sealing layer 32, as well.

Moreover, since the volumetric capacity of the first cavity 6 is set at a constant spatial volume determined by the planar area of the gap ranging over the distance d1 between the first split layers 211 and 212 and the layer thicknesses of the first split layers 211 and 212. Thus, constant characteristics can be assured. The volumetric capacity of the second cavity 7 is set in a similar manner.

As explained earlier, the first and second sealing layers 22 and 32 may be formed by a means such as screen printing as well. In this case, too, the first and second sealing layers 22 and 32 only need to be formed on the plane of the first and second hollow layers 21 and 31. As a result, the process of aligning the first sealing layer 22 relative to the first hollow layer 21 and the process of lining the second sealing layer 32 relative to the second hollow layer 31, which are crucial in the prior art, can be eliminated. Thus, no reduction in the degree of airtightness attributable to an erroneous alignment occurs.

Figure 39:
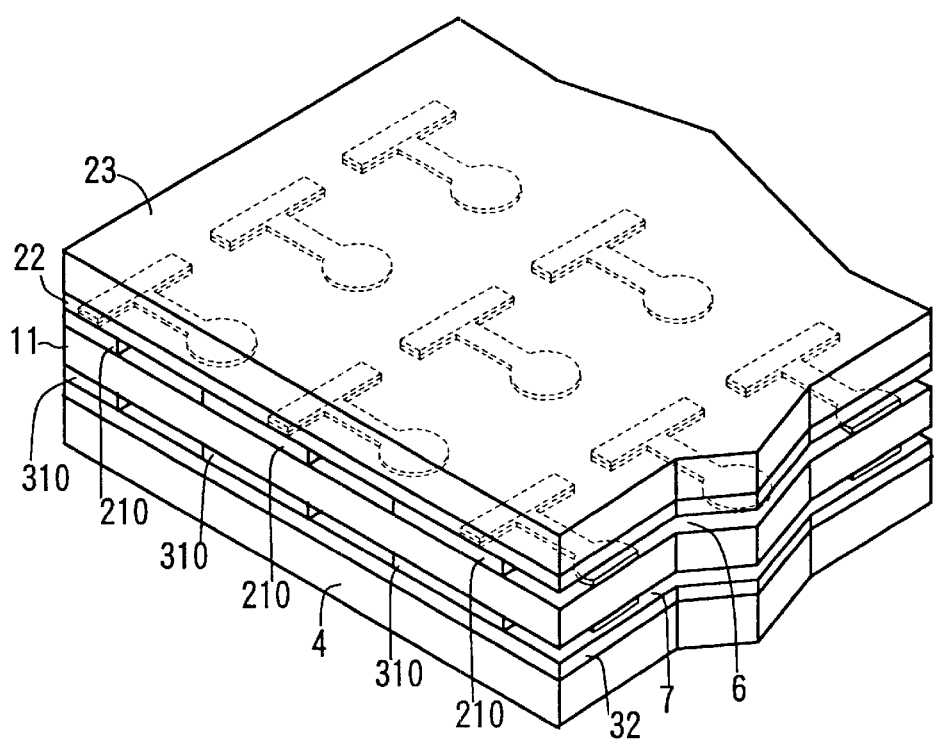
FIG. 39 is a perspective illustrating a manufacturing step implemented after the step shown in FIGS. 37 and 38.
Figure 40:
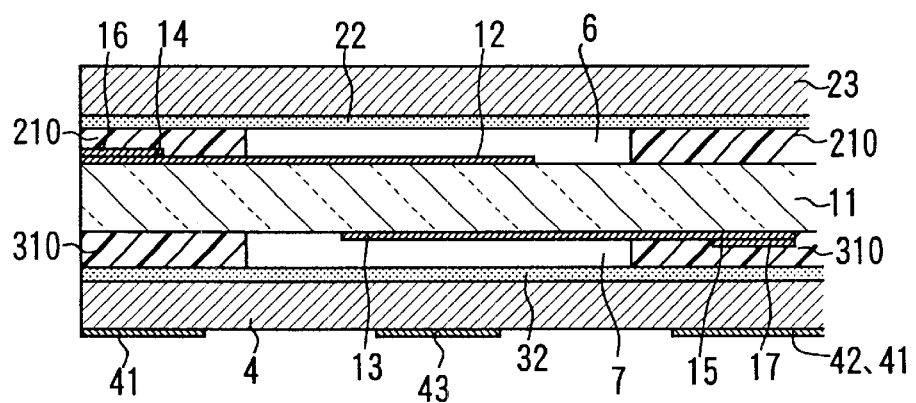
FIG. 40 is a sectional view illustrating the step shown in FIG. 39 in an enlargement.

Then, as illustrated in FIGS. 39 and 40, the base substrate 4 is bonded to the second sealing layer 32 and the top plate 23 is bonded to the first sealing layer 22. The base substrate 4 and the top plate 23 may be bonded by taking advantage of the adhesive force achieved by the second sealing layer 32 and the first sealing layer 22 or by taking advantage of the adhesive force of bonding layers provided at the first surfaces of the second sealing layer 32 and the first sealing layer 22.

The base substrate 4 is manufactured through a process implemented separately from the process of manufacturing assemblies each comprising the piezoelectric element 1, the first film structure 2 and the second film structure 3. It is desirable to form first terminal electrodes 41, second terminal electrodes 42 and third terminal electrodes 43 in strips at the bottom surface of the base substrate 4. The first terminal electrode 41 of one piezoelectric element and the second terminal electrode 42 of an adjacent piezoelectric element are formed as an integrated unit.

Figure 41:
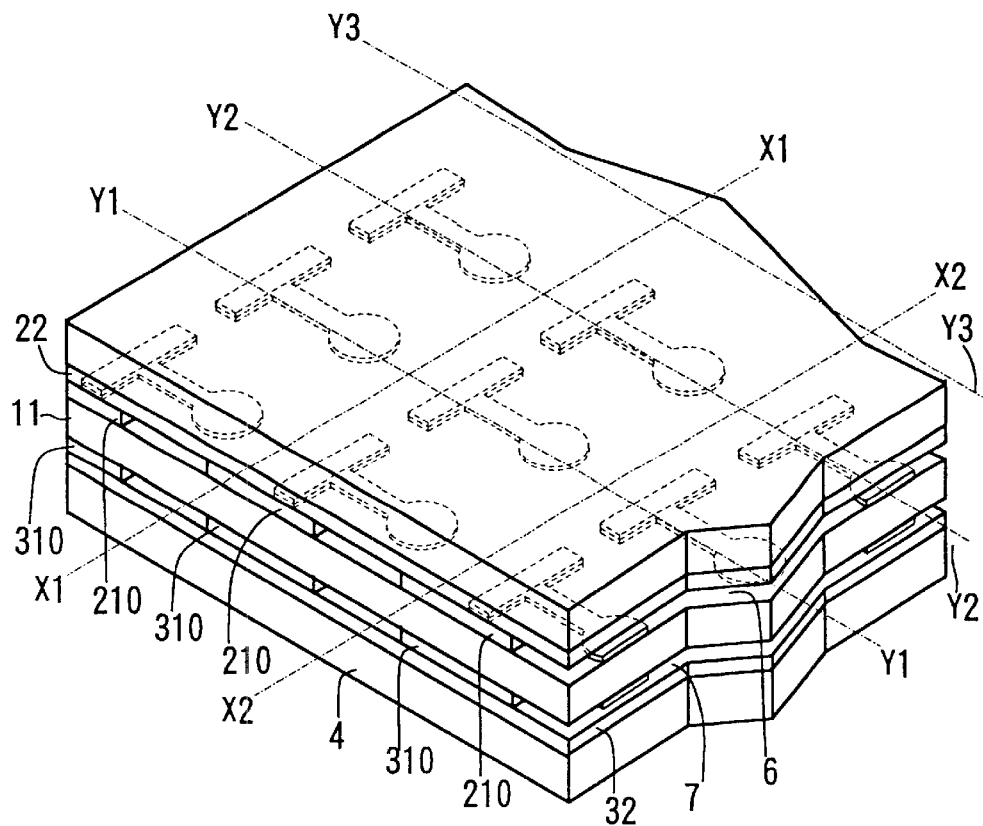
FIG. 41 is a perspective illustrating a manufacturing step implemented after the step shown in FIGS. 39 and 40.
Figure 42:
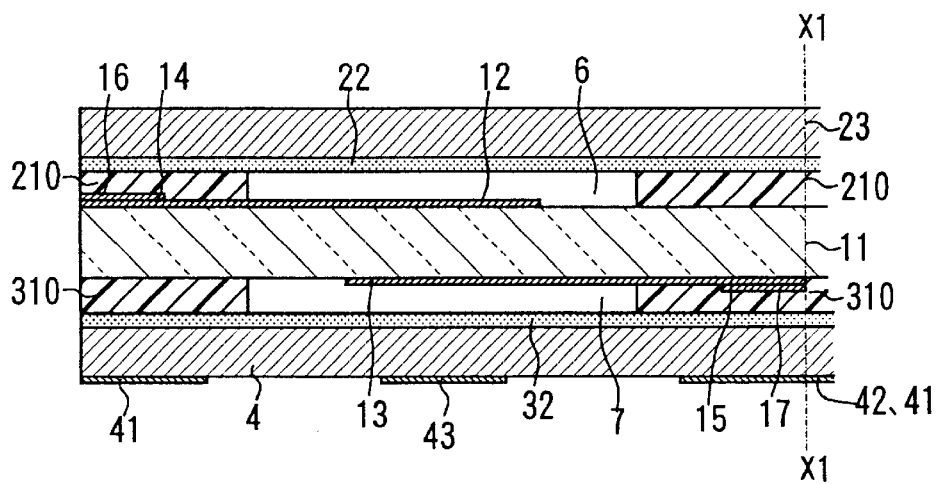
FIG. 42 is a sectional view illustrating the step shown in FIG. 41 in an enlargement.
Figure 43:
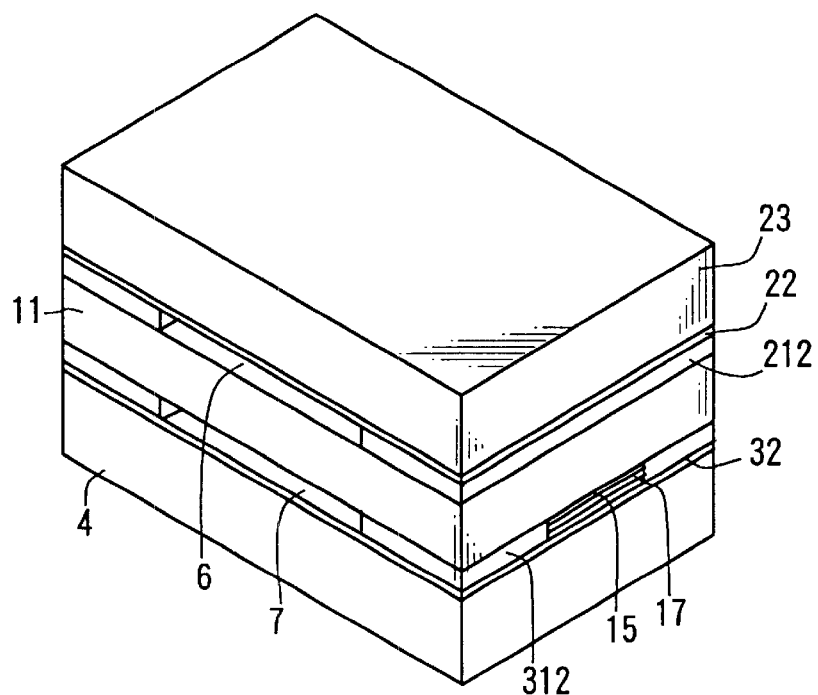
FIG. 43 is a perspective of a piezoelectric device (unfinished) obtained through the step illustrated in FIGS. 41 and 42.

Then, as illustrated in FIGS. 41 and 42, the assembly that includes the base substrate 4, the wafer-type piezoelectric substrate 11, the first hollow layer 21, the first sealing layer 22, the second hollow layer 31, the second sealing layer 32 and the top plate 23 is cut along line X1—X1, line X2—X2 and line Y1—Y1 to line Y3—Y3. A dicing saw may be utilized as a means for cutting. After this cutting step, individual piezoelectric devices (unfinished), as shown in FIG. 43, are obtained.

Figure 44:
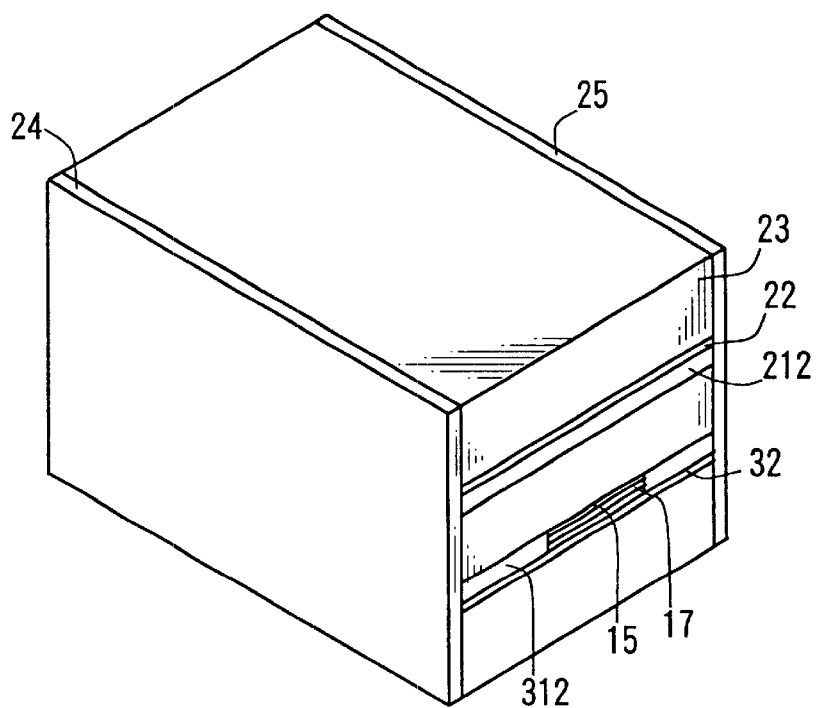
FIG. 44 is a perspective of a piezoelectric device (unfinished) achieved by forming the third sealing layers at the piezoelectric device (unfinished) shown in FIG. 43.

Then, as illustrated in FIG. 44, third and fourth sealing layers 24 and 25 are formed. During this step, the third and fourth sealing layers 24 and 25 are formed at the two side surfaces of each assembly. The first cavity 6 formed by the first film structure 2 and the second cavity 7 formed by the second film structure 3 are thus sealed by the third film structures 24 and 25. Since the third and fourth sealing layers 24 and 25 are formed at the two side surfaces of the assembly, which includes the piezoelectric element 1, the first film structure 2 and the second film structure 3, a sufficient bonding or pasting area is assured. Thus, vibration spaces, the degree of airtightness of which is not readily reduced, are achieved. In addition, since the third and fourth sealing layers 24 and 25 are formed at the two side surfaces, the volumetric capacities of the first cavity 6 and the second cavity 7 do not fluctuate. The volumetric capacities of the first cavity 6 and the second cavity 7 are set at constant spatial volumes respectively determined by the planar areas of the gaps ranging over the distances between the first split layers 211 and 212 and between the second split layers 311 and 312 and the layer thicknesses of the split layers (211, 212) and the split layers (311, 312). As a result, constant characteristics are assured.

Figure 45:
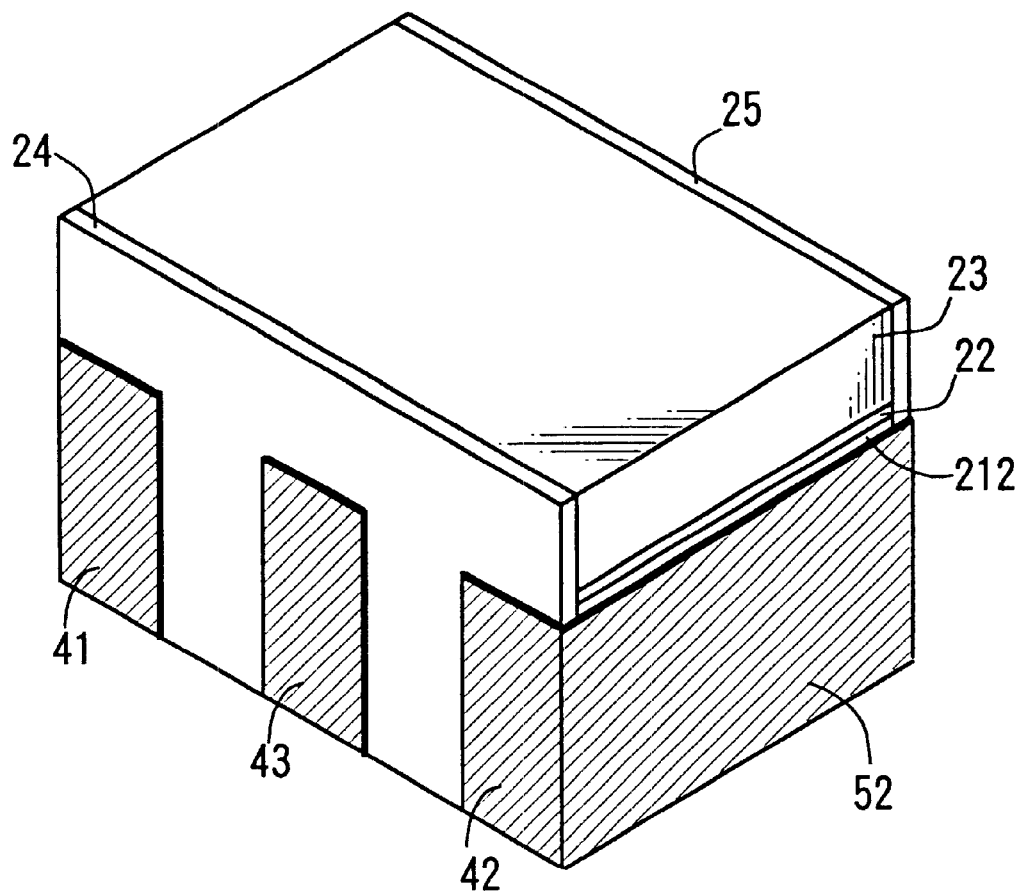
FIG. 45 is a perspective of a piezoelectric device (finished) obtained by forming electrodes at the piezoelectric device (unfinished) shown in FIG. 44.

Then, as illustrated in FIG. 45, the first terminal electrode 41, the second terminal electrode 42, the third terminal electrode 43 and the first and second connection electrodes 51 and 52 are formed at side surfaces of the assembly. Thus, an end of the first terminal electrode 41 is electrically connected to an end of the first lead electrode 14 and an end of the second terminal electrode 42 is electrically connected to an end of the second lead electrode 15. The first terminal electrode 41 through third terminal electrode 43 and the first and second connection electrodes 51 and 52 may be formed by plating a thin film formed by a means for thin film formation such as sputtering.

Figure 46:
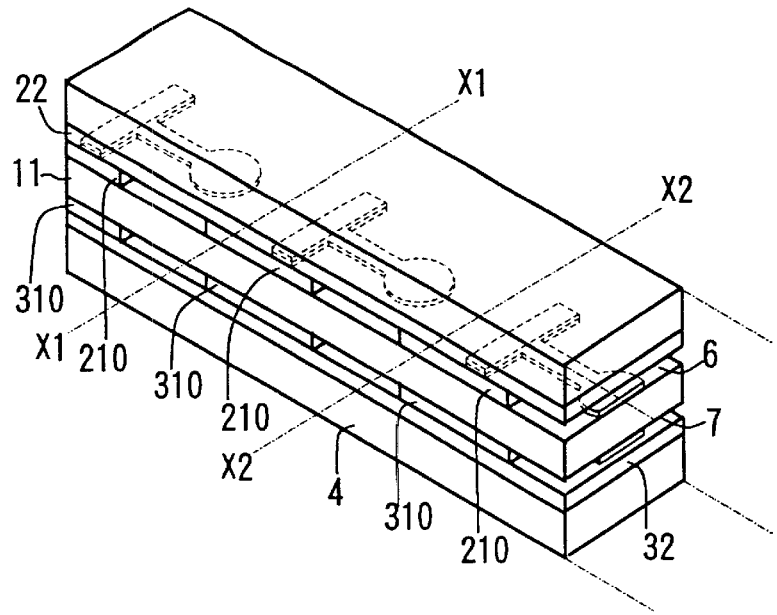
FIG. 46 is a perspective illustrating another cutting method.

FIG. 46 illustrates another efficient cutting method that may be adopted. In FIG. 46, the assembly that includes the base substrate 4, the wafer-type piezoelectric substrate 11, the first hollow layer 21, the first sealing layer 22, the second hollow layer 31, the second sealing layer 32 and the top plate 23 is cut along line Y1—Y1, line Y2—Y2, line Y3—Y3, in FIG. 41 to obtain rectangular assemblies, each having a plurality of sets each constituted of a first electrode and a second electrode arrayed in a single row.

Figure 47:
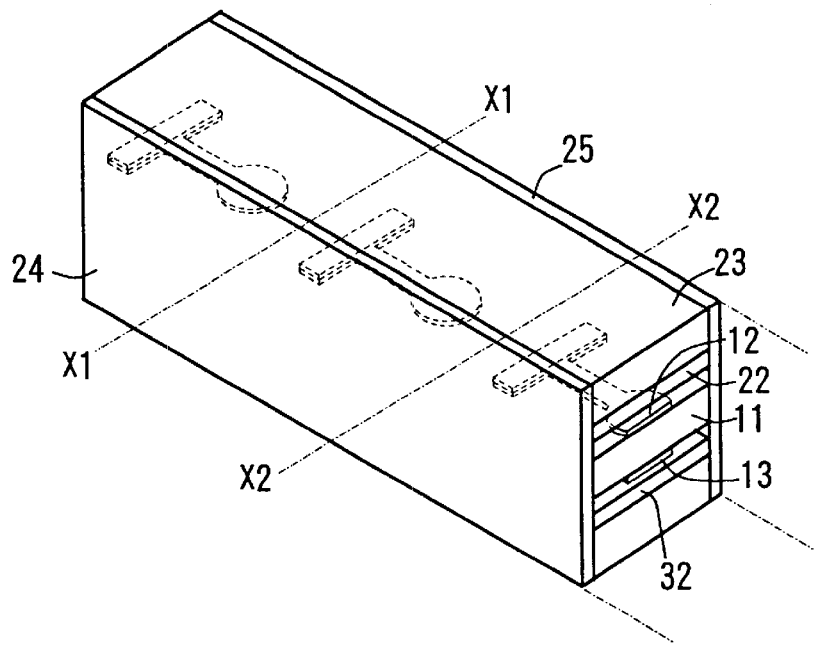
FIG. 47 is a perspective illustrating a manufacturing step implemented after the step shown in FIG. 46.
Figure 48:
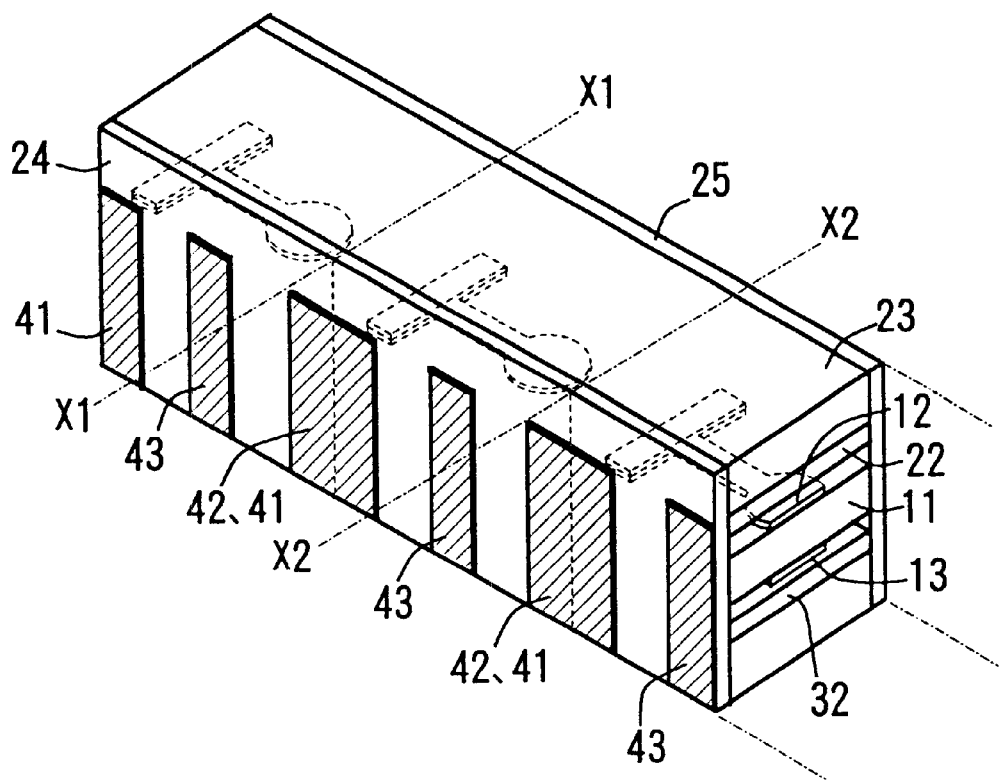
FIG. 48 is a perspective illustrating a manufacturing step implemented after the step shown in FIG. 47.

In the following step, the third and fourth sealing layers 24 and 25 are formed at the side surfaces of each rectangular assembly as illustrated in FIG. 47. Next, as illustrated in FIG. 48, first terminal electrodes 41, second terminal electrodes 42 and third terminal electrodes 43 are formed at a side surface of the rectangular assembly. Then, the rectangular assembly is cut along line X1—X1 and line X2—X2 in FIG. 48. In the next step, the first and second connection electrodes 51 and 52 are formed at the cut surfaces, as shown in FIG. 48. Thus, an end of the first terminal electrode 41 is electrically connected with an end of the first lead electrode 14 and an end of the second terminal electrode 42 is electrically connected to an end of the second lead electrode 15. By adopting the manufacturing method illustrated in FIGS. 46 to 48, the first terminal electrodes 41 through third terminal electrodes 43 can be formed all at the same time for a plurality of piezoelectric elements contained in each rectangular assembly to improve the efficiency of the terminal electrode formation process.

Although not shown, a piezoelectric device to be utilized as a filter, constituted as shown in FIGS. 4 to 6 by adopting the second mode, too, can be manufactured through similar steps.

What is claimed is:

1. A method of manufacturing a piezoelectric device comprising the steps of:

forming a first film structure and a second film structure wherein:

said first film structure comprises the steps of:

applying a first resist resin to a first surface of a piezoelectric substrate having numerous sets of electrodes each constituted of a first electrode and a second electrode facing opposite each other at said first surface and a second surface, so as to individually cover said first electrodes;

forming a first resin layer to constitute a first hollow layer on said first surface of said piezoelectric substrate where said first resist resin is not present;

forming a through hole corresponding to each of said first electrodes by removing said first resist resin; and forming a first sealing layer over said first resin layer;

said second film structure comprises the steps of:

applying a second resist resin to said second surface of said piezoelectric substrate so as to individually cover said second electrodes;

forming a second resin layer to constitute a second hollow layer on said second surface of said piezoelectric substrate where said second resist resin is not present;

forming a second through hole corresponding to each of said second electrodes by removing said second resist resin; and forming a second sealing layer over said second resin layer.

2. The manufacturing method of claim 1, further comprising the steps of:

bonding a base substrate to said second sealing layer;

bonding a top plate to said first sealing layer; and cutting an assembly constituted of said top plate, said first sealing layer, said first hollow layer, said piezoelectric substrate, said second hollow layer, said second sealing layer and said base substrate.

3. The manufacturing method of claim 1, further comprising the step of:

arraying rectangular assemblies each having a plurality of sets of said electrodes in a single row.

4. The manufacturing method of claim 3, further comprising the steps of:

forming a first terminal electrode to electrically connect to said first electrode at a side end surface of said rectangular assembly for each of said sets of electrodes at each of said rectangular assemblies; and forming a second terminal electrode to electrically connect to said second electrode at a side end surface of said rectangular assembly, for each of said sets of electrodes at each of said rectangular assemblies.

5. The manufacturing method of claim 4, further comprising the step of:

cutting said rectangular assembly having said first terminal electrodes and said second terminal electrodes formed therein into individual sets of electrodes.

6. A method of manufacturing a piezoelectric device, comprising the steps of:

forming a first film structure and a second film structure wherein:

said first film structure comprises the steps of:

forming a first resin layer to constitute a first hollow layer in strips at a first surface of a piezoelectric substrate having numerous sets of electrodes each constituted of a first electrode and a second electrode facing opposite each other at said first surface and a second surface thereof over gaps; and forming a first sealing layer over said first resin layer;

said second film structure comprises the steps of:

forming a second resin layer to constitute a second hollow layer in strips over gaps each containing a plurality of second electrodes; and forming a second sealing layer over said second resin layer.

7. The method of manufacturing a piezoelectric device of claim 6, further comprising the steps of:

forming said first resin layer at said first surface of said piezoelectric substrate around a first resist resin after said first resist resin is applied to said first surface of said piezoelectric substrate in strips, each of said strips commonly covering a plurality of first electrodes;

removing said first resist resin to form a through hole containing a plurality of said first electrodes;

forming said second resin layer at said second surface of said piezoelectric substrate around a second resist resin after said second resist resin is applied to said second surface of said piezoelectric substrate in strips with each of said strips commonly covering a plurality of second electrodes; and removing said second resist resin to form a through hole containing a plurality of said second electrodes.

8. The manufacturing method of claim 6, further comprising the steps of:

bonding a base substrate to said second sealing layer;

bonding a top plate to said first sealing layer; and cutting an assembly constituted of said top plate, said first film structure, said piezoelectric substrate, said second film structure and said base substrate.

9. The manufacturing method of claim 8, further comprising the step of:

arraying rectangular assemblies each having a plurality of sets of said electrodes in a single row.

10. The manufacturing method of claim 9, further comprising the step of:

forming third film structures by forming a third sealing layer at each of two side surfaces of said rectangular assembly to seal said first cavity and said second cavity at said two side surfaces.

11. The manufacturing method of claim 10, further comprising the steps of:

forming a first terminal electrode to electrically connect to said first electrode at a side end surface of said rectangular assembly for each of said sets of electrodes at each of said rectangular assemblies; and forming a second terminal electrode to electrically connect to said second electrode at a side end surface of said rectangular assembly, for each of said sets of electrodes at each of said rectangular assemblies.

12. The manufacturing method of claim 11, further comprising the step of:

cutting said rectangular assembly having said first terminal electrodes and said second terminal electrodes formed therein, into individual sets of electrodes.

* * * * *